(12) United States Patent
Kanase et al.

(10) Patent No.: US 6,407,572 B1
(45) Date of Patent: Jun. 18, 2002

(54) SYSTEM AND METHOD FOR TESTING AND EVALUATING A DEVICE

(75) Inventors: Masahiro Kanase; Takayuki Katayama; Naoyoshi Kikuchi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 09/654,525

(22) Filed: Sep. 1, 2000

(30) Foreign Application Priority Data

Sep. 3, 1999 (JP) .......................................... 11-250429

(51) Int. Cl.$^7$ ............................................. G01R 31/26
(52) U.S. Cl. .................... 324/765; 324/158.1; 714/718; 714/724; 702/117
(58) Field of Search ............................ 324/765, 158.1, 324/73.1, 755; 714/718, 724; 702/117, 119; 438/14, 18, 10

(56) References Cited

U.S. PATENT DOCUMENTS 6,104,985 A * 8/2000 Sowards .................... 324/73.1
6,131,172 A * 10/2000 Sowards ..................... 324/755

* cited by examiner

*Primary Examiner*—Michael J. Sherry
*Assistant Examiner*—Jimmy Nguyen
(74) *Attorney, Agent, or Firm*—Staas & Halsey LLP

(57) ABSTRACT

A system for testing and evaluating a device, such as a LSI device, by searching for a factor of defect of the device is disclosed, in which terminals are classified into a plurality of terminal types based on information related to various testing conditions, and data concerning the margin of the testing conditions is obtained by altering the testing conditions for every terminal type. Further, a factor of defect of a specific terminal type is searched for in accordance with the data concerning the margin of the testing conditions, and a defective terminal is detected from the specific terminal type. A method for testing and evaluating the device is also disclosed, which is executed by operating the system described above.

6 Claims, 19 Drawing Sheets

Fig.12(a)

```
        MEASUREMENT RESULT MODE 1
CONDITION+2  IX X X X X X P P P
CONDITION+1  IX X X X X X P P P
Typical      IX X X X X X P P P
CONDITION-1  IX X X X X X P P P
CONDITION-2  IX X X X X P P P P   WHOLE
                                  TIMING *K
             +-----------------»LATE
             EARLY-----»
```

Fig.12(b)

```
        MEASUREMENT RESULT MODE 2
CONDITION+2  IP P P X X X X X X
CONDITION+1  IP P P X X X X X X
Typical      IP P P X X X X X X
CONDITION-1  IP P P X X X X X X
CONDITION-2  IP P P X X X X X X   WHOLE
                                  TIMING *K
             +-----------------»LATE
             EARLY-----»
```

Fig.12(c)

```
POWER SOURCE N Typical
PIN GROUP #1,T1   IX X X X X X X X X
PIN GROUP #1,T2   IX X X X X X X P P
PIN GROUP #1,T3   IX X X X X P P P P
PIN GROUP #2,T1   IX X X X X X P P P
PIN GROUP #2,T2   IX X X X X X X P P
                  «------T------»»LATE  T: Typical
                  EARLY«
```

Fig.13(a)

```
         MEASUREMENT RESULT MODE 3
CONDITION+2  IX X X X X X X X X
CONDITION+1  IX X X X X X X X X
Typical      IX X X X X X X X X
CONDITION-1  IP P P P P P P P P
CONDITION-2  IP P P P P P P P P   WHOLE
                              — — — TIMING * K
             +— — — — — — — —+
              EARLY — — —>> LATE
```

Fig.13(b)

```
         MEASUREMENT RESULT MODE 4
CONDITION+2  IP P P P P P P P P
CONDITION+1  IP P P P P P P P P
Typical      IX X X X X X X X X
CONDITION-1  IX X X X X X X X X
CONDITION-2  IX X X X X X X X X   WHOLE
                              — — — TIMING * K
             +— — — — — — — —+
              EARLY — — —>> LATE
```

Fig.13(c)

```
POWER SOURCE N Typical
PIN GROUP #1,Vt    IX X X X X X X X X
PIN GROUP #1,Out   IX X X X X X X X X
PIN GROUP #1,IL    IX X X X P P P P P
PIN GROUP #2,Vt    IX X X X X X X P P
PIN GROUP #2,Out   IX X X X X X X P P
                   <<— — — — — —>> CONDITION-1
                    Typical
```

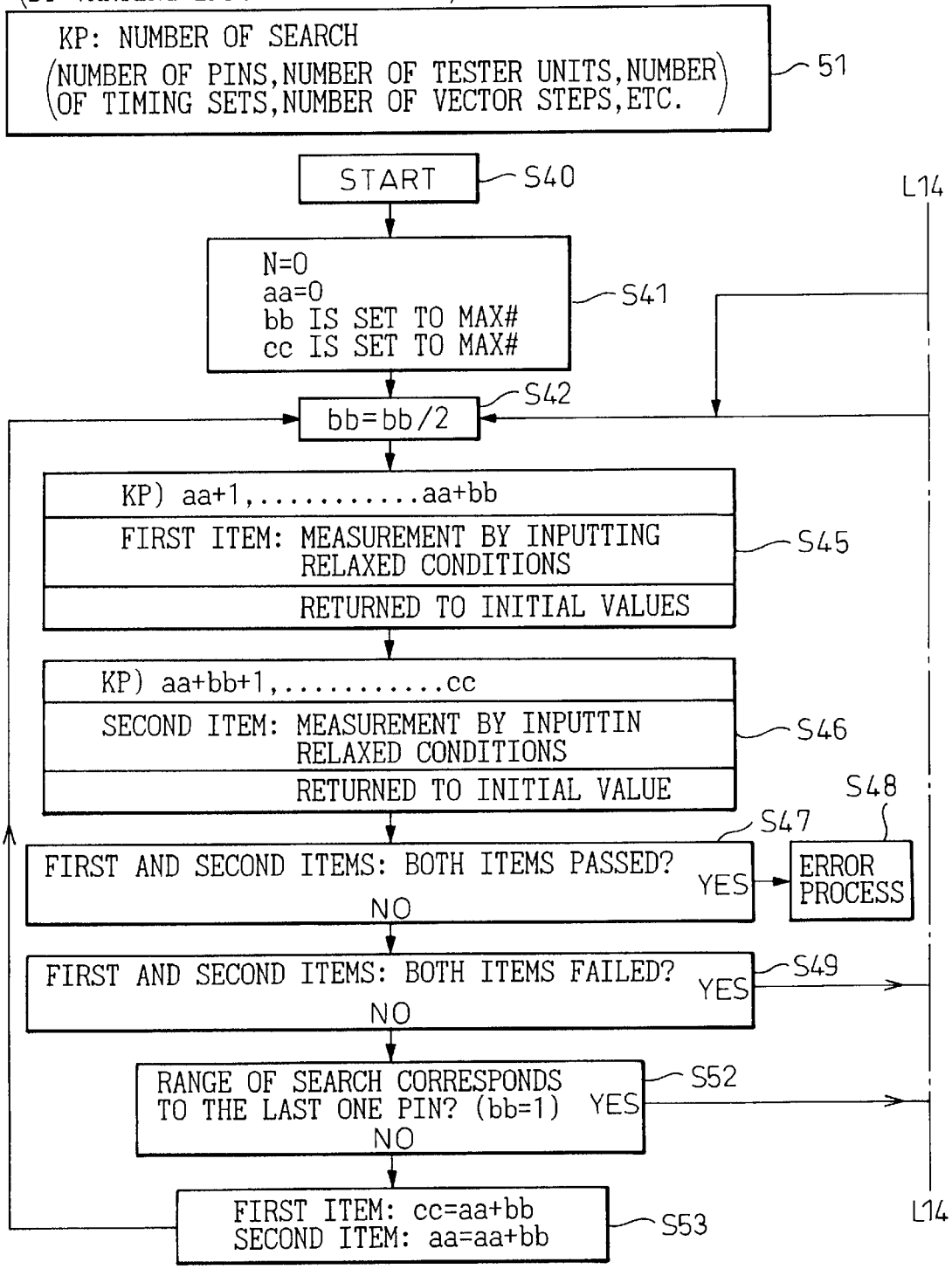

Fig.19

| PIN GROUP | TYP | ST | SP | DL | I++++I++++S++++I++++I |
|---|---|---|---|---|---|
| #1,T1 | 80ns | 60ns | 100ns | 2ns | FFFFFFFFFF*FFFFFFFFFF |
| #2,T1 | 40ns | 20ns | 60ns | 2ns | FFFFFFFFFF*FFFFFFFFFF |
| #2,T2 | 60ns | 40ns | 80ns | 2ns | FFFFFFFFFF*FFFFFFFFFF |
| #3,T1 | 20ns | 0ns | 40ns | 2ns | ------ FFFF*FFFFFFFFFF |
| #4,T1 | 10ns | 0ns | 20ns | 1ns | FFFFFFFFFF*FFFFFFFFFF |
| #4,T2 | 90ns | 80ns | 100ns | 1ns | FFFFFFFFFF*FFFFFFFFFF |

SYSTEM AND METHOD FOR TESTING AND EVALUATING A DEVICE

BACKGROUND OF THE INVENTION

1. Field of the Invention

The present invention relates to a system and a method for testing and evaluating (or estimating) a device, such as a LSI (large scale integrated circuit) device, by searching for a factor of defect (i.e., a factor associated with a defect) of the device.

The recent trend in the development and test/evaluation (or estimation) of an LSI device designed by a customer has been toward the demand for a shorter and shorter time for delivering the LSI device to the customer. In order to meet this demand, it is necessary to conduct the test and evaluation of the LSI within a short time in accordance with a test program including the design data and the test data prepared by an EWS (engineering work station) tool, to extract a defective test pattern or defective test condition making up a factor of defect and to feeding the same back quickly to the LSI fabrication and design processes.

2. Description of the Related Art

The development and test/evaluation of an LSI, especially an ASIC (application specific integrated circuit) device designed by the customer are, generally carried out according to the following steps (1) to (7).

(1) The design data of the LSI data are acquired from the customer.

(2) The design data are verified by CAD (computer aided design).

(3) The device data and the test data are prepared based on the design data thus verified.

(4) A test program is produced based on the test data.

(5) The LSI prototype produced based on the design data is evaluated by the test program.

(6) The results of evaluation of the LSI prototype are fed back to the design data and process (fabrication process and design process).

The results of this feedback are used to produce the device data and the test data again, followed by returning to step (4) mentioned above.

(7) The development and the test/evaluation of the LSI device are completed.

In the aforementioned steps of developing and testing/evaluating the LSI device, such as the ASIC device, the design data and the test data are generated automatically using the EWS tool, etc. The persons engaged in the test and evaluation of the LSI device, therefore, can produce a test program without being conscious of the function or the component elements of the circuit. Even the designer of the LSI device is not required to know the contents of the design data from the customer.

As described above, the test and estimation of the LSI device are conducted based only on the state of the test data without using the design data or the CAD data. In the case in which a defective LSI device occurs as a result of a LSI device test, therefore, it is necessary to pinpoint the conditions for making a conforming LSI device by altering the information for setting the testing conditions (pins (terminals), timing, input level, source voltage, etc.). In other words, the defect test pattern or the defect test conditions are required to be fed back to the LSI device fabrication and design processes and to quickly correct any problem points of the design and fabrication processes.

In the test and estimation of the LSI device, the conditions for a conforming LSI device are searched for by altering the testing conditions arbitrarily, and therefore a great amount of time is consumed. In recent years, partly because both the number of terminals (pins) and the density of the LSI have been increasing, the test and evaluation of the LSI device using the LSI testing device (LSI tester) is expected to consume a longer time in the future. While the current trend is toward multiple functions and a higher cost of the LSI testing device as described above, a reduced time length for testing and evaluating the LSI device contributes to a shorter time for accomplishing the development and the test/evaluation of the LSI device.

In actually conducting the test and evaluation of a LSI device, the source voltage, the difference between the simulated test environment and the actual test environment of the LSI device sometimes causes a delicate shift of the source voltage, the input level, the input timing and the output timing from the actual testing conditions.

For this reason, in conducting the test and evaluation of a LSI device or the like according to the conventional method, the conforming (good) or nonconforming (defective) LSI devices are determined while shifting the testing condition for each pin (terminal), and by thus finding out the condition for producing a conforming LSI device, a factor of defect of the device tested has been searched for. In other words, all the pins of the LSI device have been debugged by shifting the testing condition for each pin based on the judgment of the human being.

More specifically, in the conventional test and evaluation method for searching for the conditions for producing a conforming LSI device, a search time required for the search can be simply calculated according to the following formula:

$$\text{Search time} = (\text{Logic verification time per pilot}) \times (\text{number of pins}) \times (\text{number of timing edges (TE) per pin}) \times (\text{number of steps})$$

For example, the search time for a LSI device having 100 I/O (input/output) pins is determined as follows.

Assuming that the logic verification time per pilot is 100 ms and the logic verification is conducted in 40 steps per ns (nanosecond), $$\text{Search time} = 100 \text{ ms} \times 100 \text{ pins} \times 1 \text{ TE} \times 40 \text{ steps}$$
$$= 4000 \text{ pilots} \times 100 \text{ ms}$$
$$= 400 \text{ seconds}$$
$$= 6.6 \text{ minutes}$$

The mainstay of current LSI devices is 300 to 500 pins which is evaluated to consume a search times three to five times (300 to 500 pins) as long as the aforementioned search time. On the other hand, the aforementioned test and evaluation method makes it possible to search for the conditions for a conforming LSI device only in the case in which a defective pin having the factor of defect is only one. In the case in which there are a plurality of defective pins, therefore, the testing conditions are required to be set manually, taking combinations of the testing conditions into consideration in order to search for all the defective pins. This requires a remarkably large number of steps, often making it practically impossible to search for the conditions for a conforming LSI device.

As described above, the time required for searching for the conditions for a conforming LSI device by the conventional device test and evaluation method is so vast that any factor of defect may not be found in the case in which there are a plurality of defective pins. Further, the subjective judgment of the person engaged in this test and estimation requires technical know-how. Consequently, the same evaluation results cannot be easily obtained for every person.

SUMMARY OF THE INVENTION

In view of the problem described above, the object of the present invention is to provide a system and a method for testing and evaluating a device, such as a LSI device, in which the testing conditions can be automatically and quickly altered to search for a factor of defect.

In order to achieve the object described above, according to one aspect of the present invention, there is provided a system for testing and evaluating a device by searching for a factor of defect-thereof, comprising:

a unit for classifying terminals into a plurality of terminal types, based on the information for setting various testing conditions for the device;

a unit for obtaining the data concerning the margin of the testing conditions by altering the testing conditions for each every terminal type; and a unit for searching for a factor of defect of a specific terminal type in accordance with the data concerning the margin of the testing conditions and detecting a defective terminal from the specific terminal type.

Preferably, in the system according to the present invention, the terminal types include a clock input terminal group, a data input and address input terminal group, a data output terminal group and a control signal input terminal group.

Preferably, in the system according to the present invention, the testing conditions at least include a source voltage, an input level, an output level and the signal timing of the device.

Preferably, in the system according to the present invention, the data concerning the margin of the testing conditions are obtained by altering a source voltage, an input level and an output level of each of the terminal types and shifting edges of the signal timing.

According to another aspect of the present invention, there is provided a method for testing and evaluating a device by searching for a factor of defect thereof, comprising the steps of:

classifying terminals into a plurality of terminal types, based on information related to various testing conditions for the device;

obtaining the data concerning the margin of the testing conditions by altering the testing conditions for each of a plurality of the terminal types; and searching for a factor of defect of a specific terminal type in accordance with the data concerning the margin of the testing conditions and detecting a defective terminal from the specific terminal type.

In the system and the method for testing and evaluating the device according to this invention, the information for setting the various testing conditions for a device, such as a LSI device, are read out so that all the terminals are classified into a plurality of groups of terminal types, the testing conditions are altered for each of the terminal types classified into these groups to search for a specific terminal type having a factor of defect, and a defective terminal (pin) is detected from the specific terminal type. Thus, a factor of defect of the device to be tested can be assuredly found out within a comparatively short time.

BRIEF DESCRIPTION OF THE DRAWINGS

The above object and features of the present invention will be more apparent from the following description of the preferred embodiments with reference to the accompanying drawings, wherein:

FIGS. 12(a), 12(b) and 12(c) are diagrams showing an example of the form of a pass area and the margin of the pin classification in modes 1 and 2;

FIGS. 13(a), 13(b) and 13(c) are diagrams showing an example of the form of a pass area and the margin of the pin classification in modes 3 and 4;

FIG. 14 is a first flowchart for explaining the steps for specifying a factor of defect by operating a program in a device test and evaluation system according to the present invention;

FIG. 19 is a diagram showing the margin of the pin classification obtained for each pin group.

DESCRIPTION OF THE PREFERRED EMBODIMENTS

A basic embodiment and preferred embodiments of the present invention will be explained below with reference to the accompanying drawings (FIGS. 1 to 19).

Figure 1:
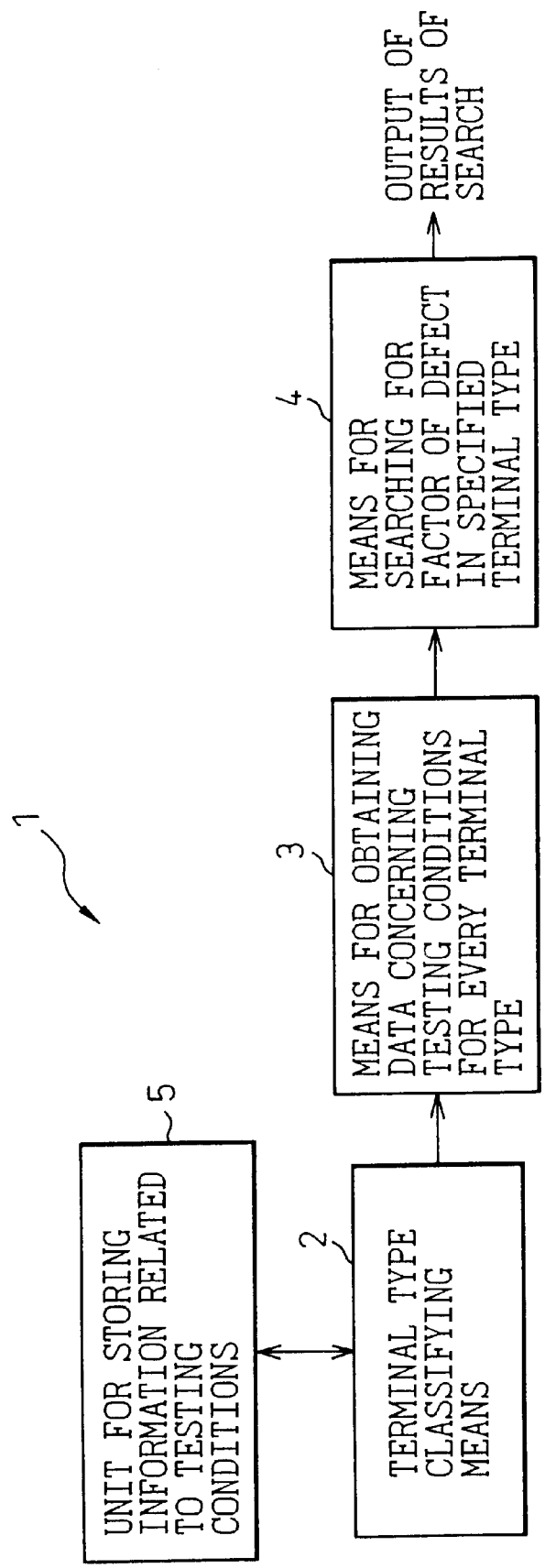
FIG. 1 is a block diagram showing a configuration according to a basic embodiment based on the principle of the present invention.

FIG. 1 is a block diagram showing a configuration of a basic embodiment based on the principle of the present invention. The configuration of a system for testing and evaluating a device according to the basic embodiment of the present invention, however, is shown in a simplified form.

As shown in FIG. 1, a system 1 for testing and evaluating a device by searching for a factor of defect thereof according to the basic embodiment of the present invention comprises means 2 for classifying terminals into a plurality of terminal types, based on the information related to various testing conditions for the device; means 3 for obtaining the data concerning the margin of the testing conditions by altering the testing conditions for each of the terminal types; and means 4 for searching for a factor of defect of a specific terminal type in accordance with the data concerning the margin of the testing conditions and detecting a defective terminal from the specific terminal type.

Preferably, in the system according to the basic embodiment of the present invention, the terminal types include a clock input terminal group, a data input terminal group, address input terminal group, a data output terminal group and a control signal input terminal group.

Preferably, in the system according to the basic embodiment of the present invention, the testing conditions at least include the source voltage, the input level, the output level and the signal timing of the device. The information for setting the testing conditions are stored in a unit 5 for storing the information related to the testing conditions and read out as required.

Preferably, in the system according to the basic embodiment of the present invention, the data concerning the margin of the testing conditions are obtained by altering the source voltage, the input level and the output level of each of the terminal types and shifting the edges of the signal timing.

On the other hand, a method for testing and evaluating a device by searching for a factor of defect thereof by using the above-mentioned system according to the basic embodiment, or the like, comprises the steps of classifying terminals into a plurality of terminal types, based on the information related to various testing conditions for the device; obtaining the data concerning the margin of the testing conditions by altering the testing conditions for each of a plurality of the terminal types; and searching for a factor of detect of a specific terminal type in accordance with the data concerning the margin of the testing conditions and detecting a defective terminal from the specific terminal type.

In summary, according to the basic embodiment of the present invention, the information for setting the various testing conditions of a device, such as an LSI device, to be tested are read out, all terminals are classified into a plurality of groups of terminal types, the testing conditions are altered for each of the terminal types classified into groups to search for a specific terminal type having a factor of defect, and a defective terminal is detected from the specific terminal type. Thus, a factor of defect of the device to be tested can be assuredly found out within a comparatively short time.

Figure 2:
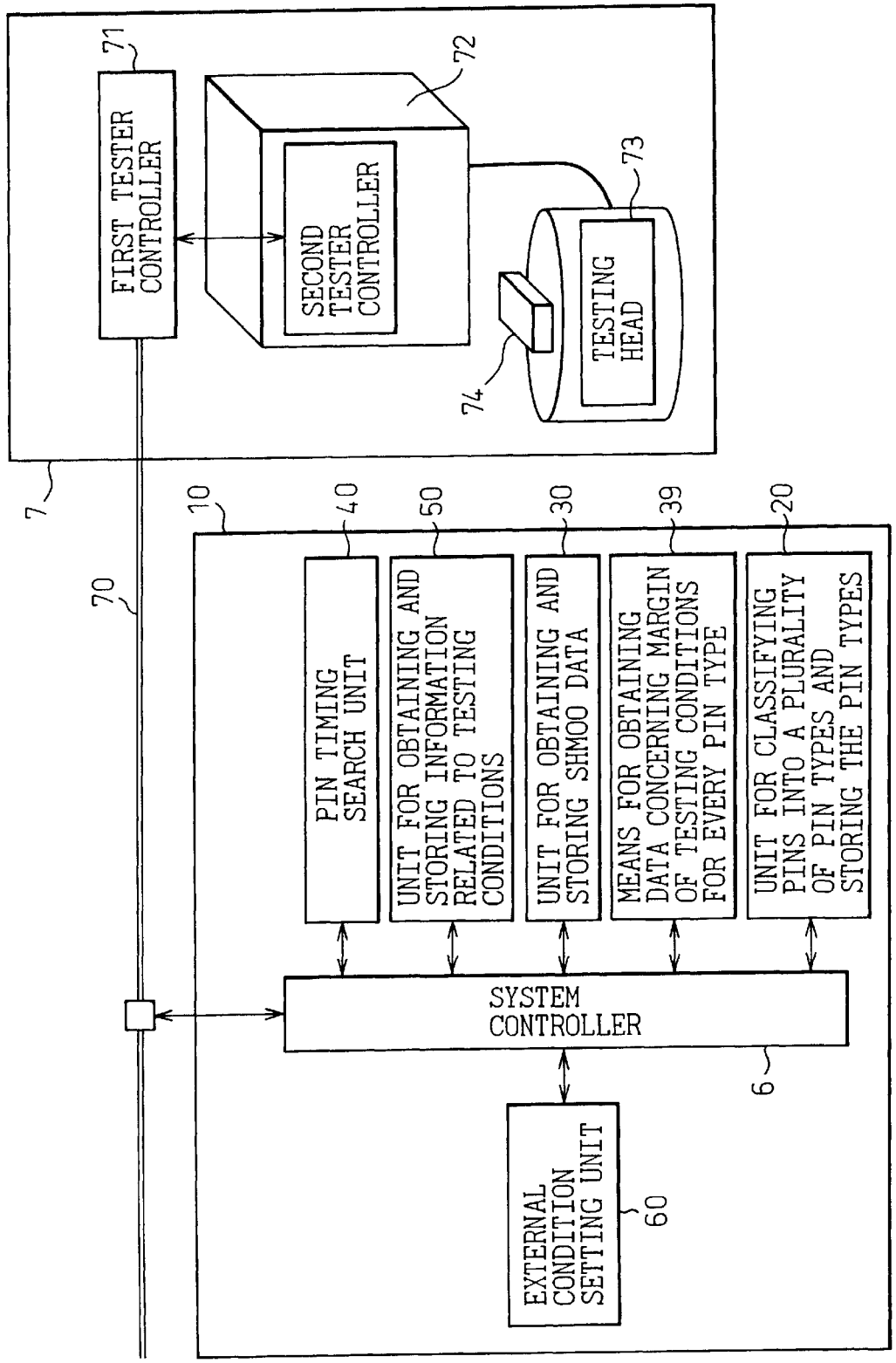
FIG. 2 is a block diagram showing a system configuration according to a preferred embodiment of the present invention.

FIG. 2 is a block diagram showing a system configuration according to a preferred embodiment of the present invention. This shows a general configuration of a system 10 for testing and evaluating an LSI device 10 as a preferred embodiment of the present invention for testing and evaluating an LSI device (device to be tested 74) mounted on a body of an LSI tester 7. Those component elements similar to the aforementioned ones will hereinafter be designated by the same reference numerals, respectively.

The system 10 for testing and evaluating the LSI device shown in FIG. 2 includes a system controller 6 for controlling a series of operation for specifying a factor of defect of the LSI device by altering the testing conditions (input conditions) applied to a plurality of pins (terminals) of the LSI device and controlling the operation of writing/reading the results of the test and evaluation of the LSI device. This system controller 6 preferably includes an MPU (microprocessor unit). The system controller 6 is initially set by an external condition setting unit 60 including a RAM (random access memory) or the like. The contents of the external condition setting unit 60 can be changed from outside.

Further, the system 10 for testing and evaluating the LSI device shown in FIG. 2 comprises a unit 50 for obtaining and storing information related to various testing conditions of the LSI device and sending out the same information to the system controller 6. The testing conditions for the LSI device include the source voltage supplied to the LSI device, an input level for applying an input, an output level for determining an output and the signal timing. The information for setting these testing conditions is digitized when reading the testing conditions from the body of the LSI tester 7. Further, the system 10 for testing and evaluating the LSI device comprises a unit 20 for classifying pins into a plurality pin types and storing the pin types by grouping the pins into a plurality of pin types having the same testing condition data, based on the information of each pin for setting the testing conditions of the LSI device. The pin data classified into a plurality of pin types is stored in the RAM or the like of the unit 20.

Further, the system 10 for testing and evaluating the LSI device shown in FIG. 2 comprises a unit 30 for obtaining and storing SHMOO data by altering the various testing conditions two-dimensionally, based on the pin classification data stored in the unit 20, and means 39 for obtaining data concerning the margin of the testing conditions for every pin type by shifting the timing of the signal for each pin type classified by the unit 20. The SHMOO data is defined as two-dimensional data for determining a search range of the conditions for securing a conforming LSI device while altering the testing conditions such as the source voltage along the ordinate and altering the testing conditions such as the signal timing along the abscissa.

Further, the system 10 for testing and evaluating the LSI device comprises a pin timing search unit 40 for specifying a defective pin having a factor of defect by altering the timing edge of the input signal in accordance with the data concerning the margin of the testing conditions obtained for each pin type by the means 39 for obtaining the data concerning the margin of the testing conditions for every pin type. This pin timing search unit 40 is realized preferably by an algorithm in which a pin group of a specific pin type including a defective pin is divided into subgroups of half size, sequentially, until an area having a defective pin is pinpointed.

The system controller 6 controls the operation of the unit 50 for obtaining and storing information for setting the testing conditions, the unit 20 for classifying pins into a plurality of pin types and storing the pin types, the unit 30 for obtaining and storing the SHMOO data, the means 39 for obtaining data concerning the margin of testing conditions for every pin type, and the pin timing search unit 40.

The data concerning the testing conditions changed within the system 10 for testing and evaluating the LSI device are supplied to the first tester controller 71 of the body of the LSI tester 7 through a line 70. The first tester controller 71 has the function as an interface between the system 10 and the body of the LSI tester 7 and sends the data concerning the testing conditions to the second tester controller 72. The second tester controller 72 supplies a testing signal corresponding to the data concerning the testing conditions to each pin of the device 74 (LSI device, for example) fixed on the tester 73.

In the preferred embodiment described above, the various testing conditions of the device to be tested such as the LSI device are read out and all the pins are grouped into a plurality of pin types, and a specific pin type having a factor of defect is searched for by altering the testing conditions by a pin timing search unit. As compared with the conventional method in which all the pins are tested sequentially, therefore, a defective pin making up a factor of defect of the device to be tested can be assuredly found out in a very short time.

Figure 3:
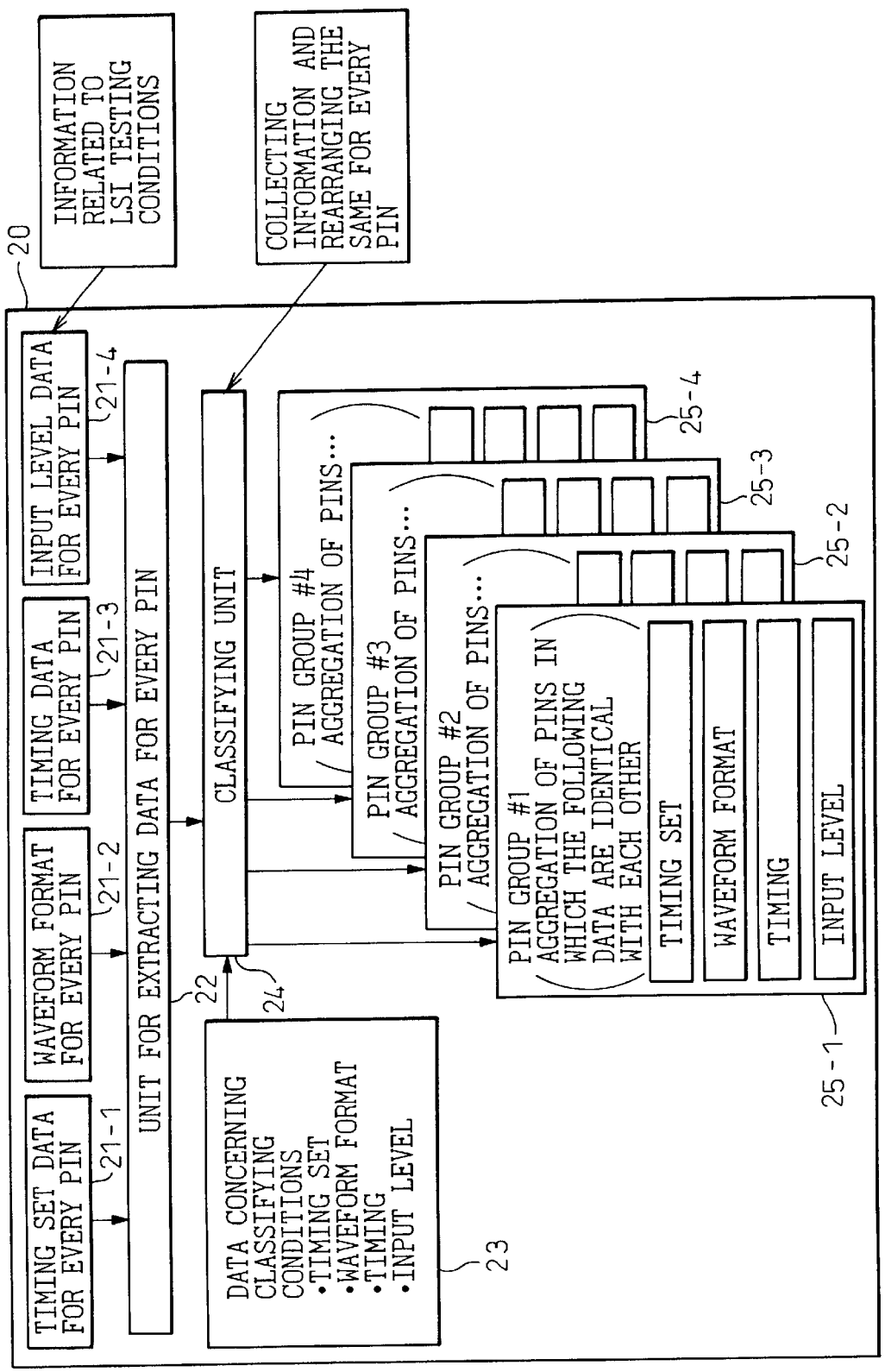
FIG. 3 is a block diagram showing a detailed configuration of a unit for classifying the pins into a plurality of pin types and storing the pin types in the system shown in FIG. 2.

FIG. 3 is a block diagram showing a detailed configuration of the unit for classing pins into a plurality of pin types and storing the pin types shown in FIG. 2.

As shown in FIG. 3, the unit 20 for classing pins into a plurality of pin types and storing the pin types according to this embodiment includes a unit 22 for extracting data concerning the information for setting the testing conditions for every pin of the LSI device, and a classifying unit 24 for collecting and rearranging the information for setting the LSI testing conditions, based on the data 23 concerning classifying conditions for every pin, and classifying the pins into a plurality of groups having the same data for the testing conditions.

The data on the information for setting the LSI testing conditions read into the unit 22 for extracting data for every pin contain timing set data 21-1 for every pin related to the timing edge of a plurality of signals, a waveform format 21-2 for every pin related to pulses, data or strobes, timing data 21-3 for every pin related to the timing of the leading and trailing edges of each signal, and input level data 21-4 for every pin for applying an input. On the other hand, the data 23 used for classifying all the pins into a plurality of groups contain the timing set data for a plurality of signals, the data for a waveform format, the data for signal timing and the data for input level.

Further, in the data classifying unit 24 of FIG. 3, the pins are classified into a plurality of groups having the same data for testing conditions related to the timing set, the wave format, timing or input level, and the data on the pin groups are stored in a RAM or the like as pin classification data. According to this embodiment, the pins are classified into four groups including a pin group #1 (25-1), a pin group #2 (25-2), a pin group #3 (25-2) and a pin group #4 (25-4).

Figure 4:
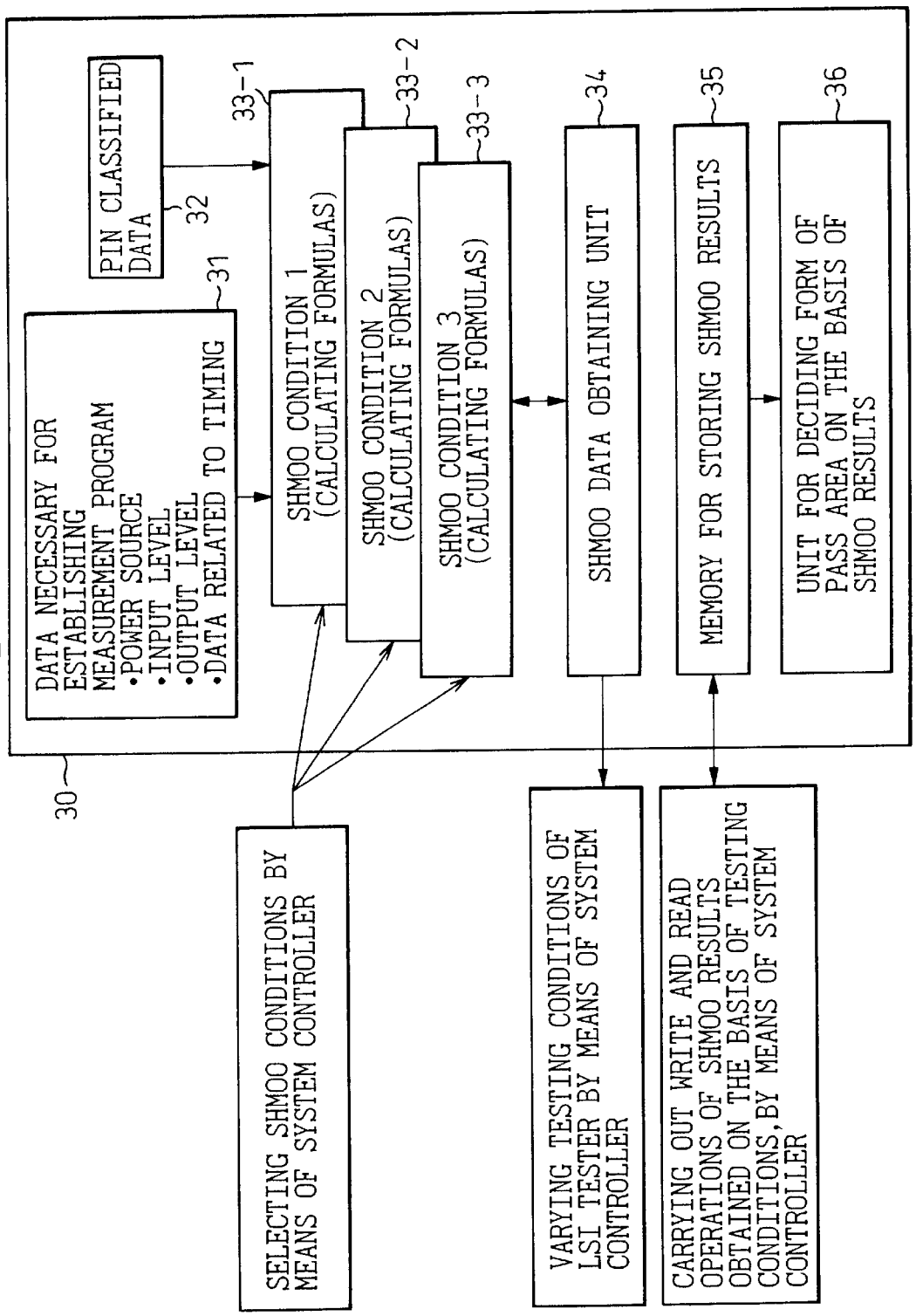
FIG. 4 is a block diagram showing a detailed configuration of a unit for obtaining and storing the SHMOO data in the system shown in FIG. 2.

FIG. 4 is a block diagram showing a detailed configuration of the unit for obtaining the SHMOO data and storing the same shown in FIG. 2.

As shown in FIG. 4, the unit 30 for obtaining and storing SHMOO data according to a preferred embodiment described above includes a unit 34 for obtaining SHMOO data by two-dimensionally altering the data on the testing conditions related to the timing set, the waveform format, the timing and the input level, based on the SHMOO conditions (SHMOO condition 1 (33-1), SHMOO condition 2 (33-2) and SHMOO condition 3 (33-3) in this case) including a plurality of formulae selected by the system controller 6 (FIG. 2). The SHMOO conditions are selected taking into account the pin classification data stored in the unit 20 and the data 31 necessary for establishing measurement program related to the power source, the input level, the output level and the timing. The SHMOO data obtained by the SHMOO data obtaining unit 34 is sent out to the body of the LSI tester 7 through the system controller 6 in order to alter the testing conditions of the device to be tested, such as the LSI device.

Further, the unit 30 for obtaining and storing the SHMOO data shown in FIG. 4 includes a memory 35 for storing SHMOO results which writes and reads the results of the test and evaluation (i.e. the SHMOO results) for the testing conditions changed with the SHMOO data through the system controller 6. The results of the test and evaluation stored in the memory 35 are used to determine the form of the pass area for the SHMOO results of a conforming LSI device in the unit 36 for deciding the form of the pass area on the basis of the SHMOO results. In this case, the unit 36 obtains the data concerning the margin of the testing conditions to determined a conforming LSI device for each pin group, based on the form of the pass area.

Figure 5:
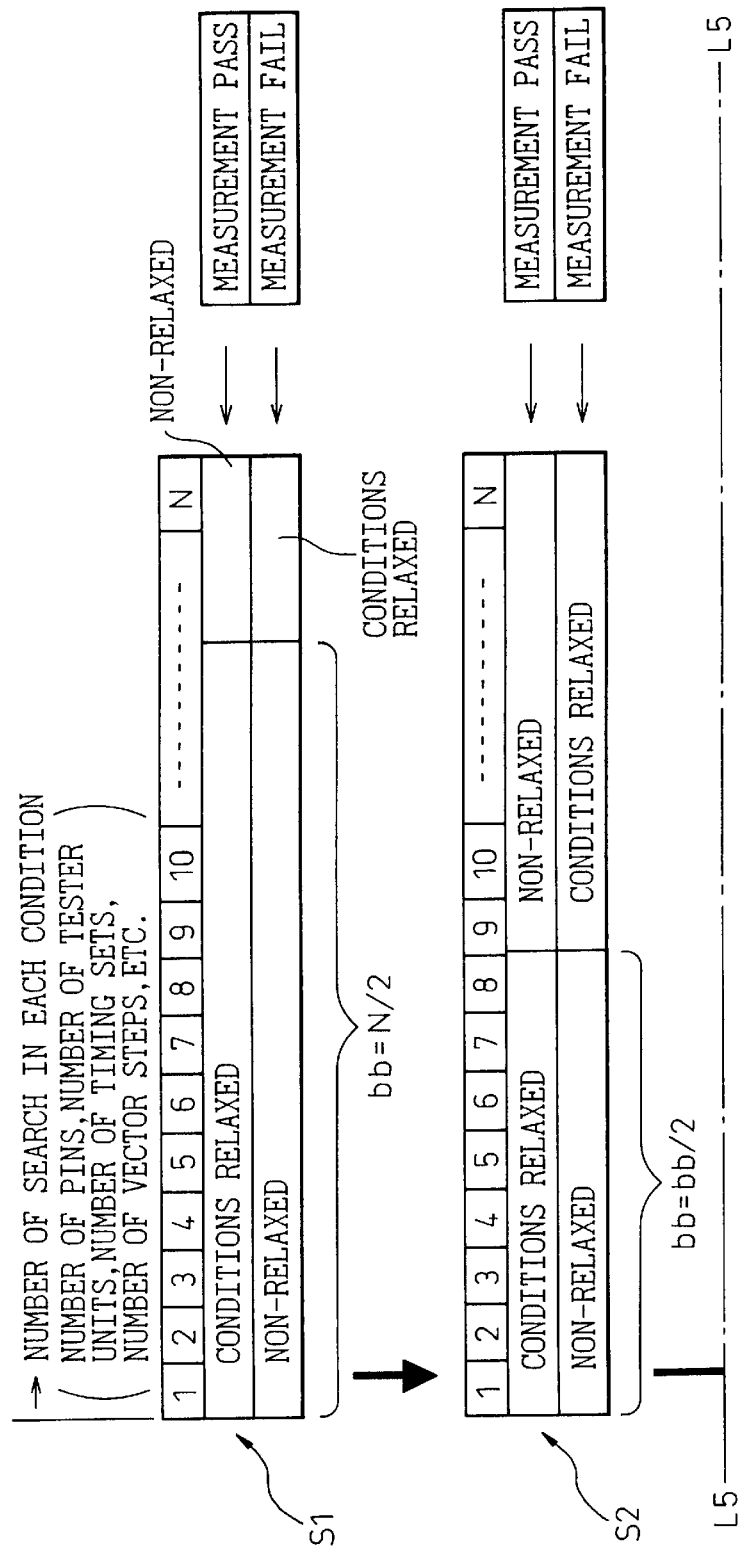
FIG. 5 is a first flowchart showing detailed steps for specifying a defective pin by altering the input conditions according to a preferred embodiment.
Figure 6:
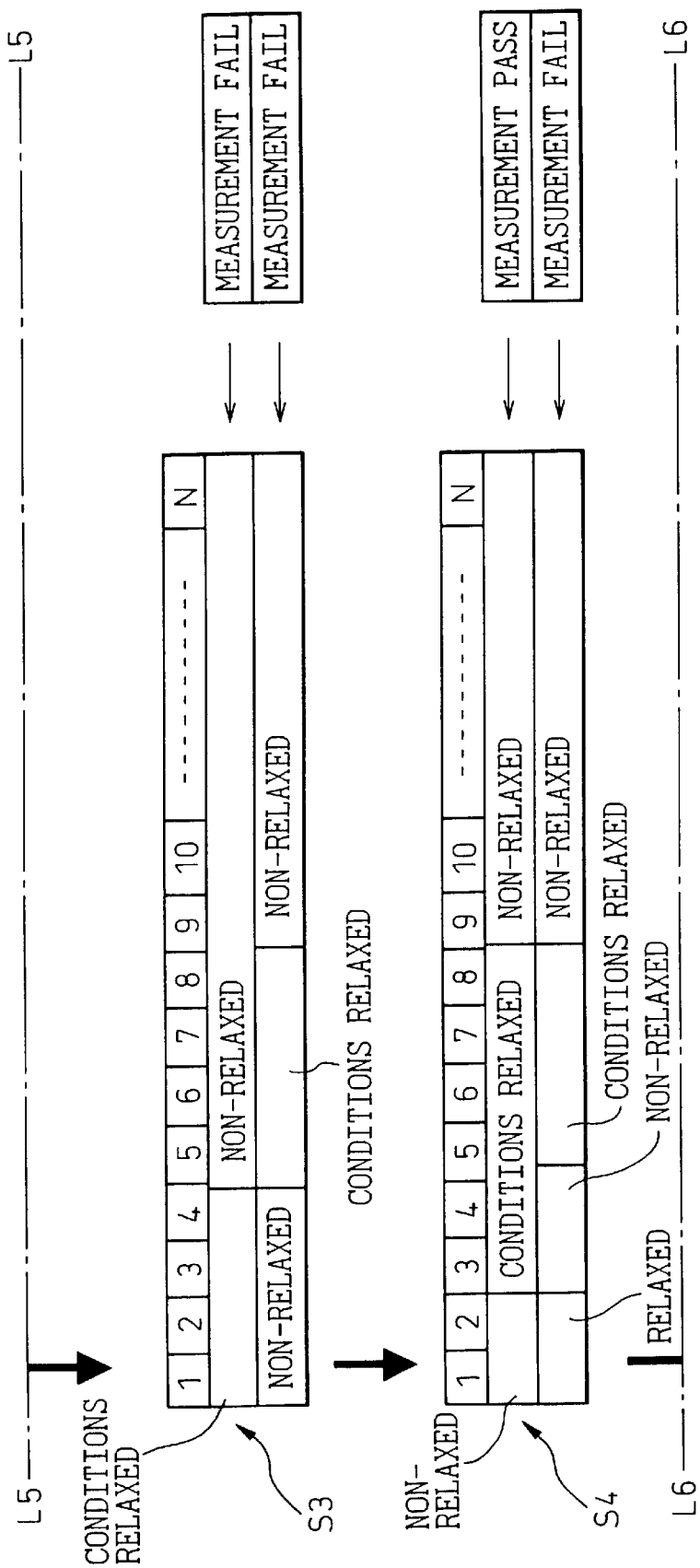
FIG. 6 is a second flowchart showing detailed steps for specifying a defective pin by altering the input conditions according to a preferred embodiment.
Figure 7:
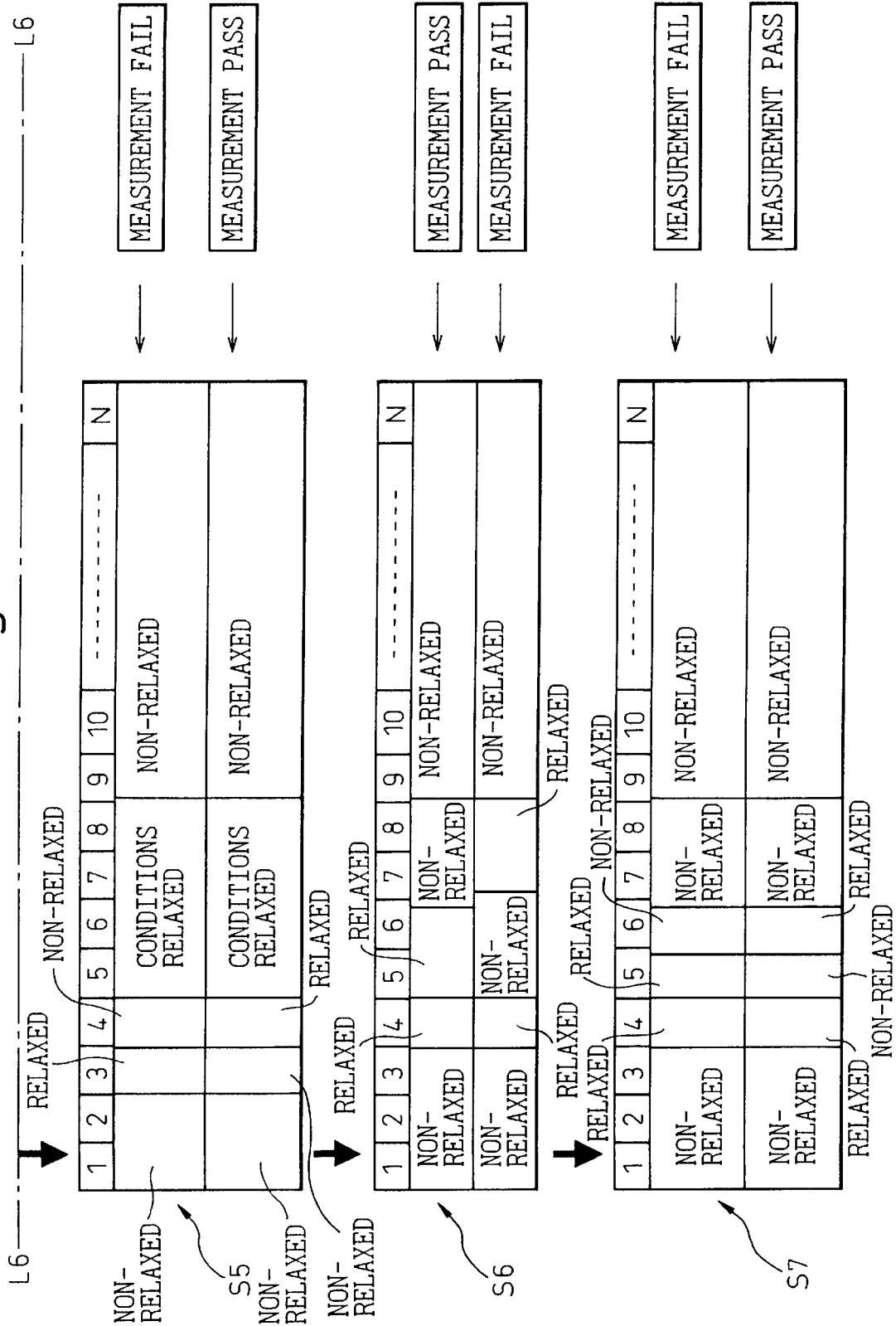
FIG. 7 is a third flowchart showing detailed steps for specifying a defective pin by altering the input conditions according to a preferred embodiment.

FIGS. 5, 6 and 7 are first, second and third flowcharts, respectively, showing detailed steps for specifying a defective pin by altering the input conditions according to a preferred embodiment.

With reference to FIGS. 5 to 7, an explanation will be given of the operation of the pin timing search unit 40 (FIG. 2) for specifying a defective pin having a factor of defect of the LSI device by altering the input conditions of the LSI device according to this embodiment. Specifically, an explanation will be given of a specific process for quickly finding which part of a search range makes up a pin (i.e. a defective pin) having a factor of defect (fail) on the basis of the results of simulation (i.e. pass or fail,) when measuring the device, such as the LSI device.

First, in step S1 of FIG. 5, the number of searches of each input condition is set. The number of searches includes the number of pins of the LSI device, the number of tester units, the number of timing sets and the number, of vector steps. For example, firstly, assume that the maximum value of the pin number of the LSI device (i.e. the number of pins, where N is a positive integer not less than 2) is defined as the number of searches for a specified pin group. A relaxed condition (the condition for the measurement pass) for a conforming product is input for a predetermined number of pins (say, pins more than N/2) in the particular pin group, while the non-relaxed condition (condition for measurement fail) making a defective product is input for the remaining pins to measure the LSI device. Secondly, the pins for which the relaxed condition is to be input and the pins for which the non-relaxed condition is to be input are replaced with each other, so that the condition reverse to the first case is input to measure the LSI device. Based on the measurements under the first and second input conditions, the next relaxed condition and the next non-relaxed condition are determined.

Then, firstly, in step S2 of FIG. 5, the relaxed condition determined in step S1 is input for, the search range (variable bb=N/2) one half of the search range corresponding to N (number of pins), while the non-relaxed condition is input for the remaining half search range to measure the LSI device. Secondly, the pins for which the relaxed condition is to be input are replaced with the pins for which non-relaxed condition is to be input, so that the condition reverse to the first case is input to measure the LSI device. In this case, as in step S1, the next relaxed condition and non-relaxed condition are determined based on the measurement under the first and second input conditions.

Further, first in step S3 of FIG. 6, the relaxed condition determined in step S2 is input for the search range (variable bb=bb/2) one half of the search range corresponding to N/2, while the non-relaxed condition is input for the remaining half search range to measure the LSI device. Secondly, the pins for which the relaxed condition is to be input are replaced with the pins for which non-relaxed condition is to be input, so that the condition reverse to the first case is input to measure the LSI device. In this case, as in step S2, the next relaxed condition and non-relaxed condition are determined based on the measurement under the first and second input conditions. In this case, however, in the search range of pins Nos. 9 to N, the measurement fails in spite of the fact that the relaxed condition for a conforming product is input, and therefore a defective pin is expected to exist in this search range.

Further, firstly, in step S4 of FIG. 6, the non-relaxed condition determined in step S3 is input for the search range one half of the search range of step S3, while the relaxed condition is input for the remaining search range (other than the search range of pins Nos. 9 to N) to measure the LSI device. Secondly, the pins for which the non-relaxed condition is to be input are replaced with the pins for which the relaxed condition is to be input, so that the condition reverse to the first case is input to measure the LSI device. In this case, as in step S2, the next relaxed condition and non-relaxed condition are determined based on the measurement under the first and second input conditions.

Then, firstly, in step S5 of FIG. 7, the non-relaxed condition determined in step S4 is input for the search range one half of the search range of step 4, while the relaxed condition is input for the remaining half search range (other than the search range of pins Nos. 9 to N) to measure the LSI device. Secondly, the pins for which the non-relaxed condition is to be input are replaced with the pins for which the relaxed condition is to be input, so that the condition reverse to the first case is input to measure the LSI device. In this case, as in the aforementioned cases, the next non-relaxed condition and relaxed condition are determined based on the measurement under the first and second input conditions.

Firstly, in step S6 of FIG. 7, the non-relaxed condition determined in step S5 is input for the search range one half as small as the search range of step 5, while the relaxed condition is input for the remaining half search range (other than the search range of pins Nos. 9 to N) to measure the LSI device. Secondly, the pins for which the non-relaxed condition is to be input are replaced with the pins for which the relaxed condition is to be input, so that the condition reverse to the first case is input to measure the LSI device. In this case, as in the aforementioned cases, the next non-relaxed condition and relaxed condition are determined based on the measurement under both the first and second input conditions. In this case, however, in the search range of pins Nos. 1 to 3, the measurement fails in spite of the fact that the relaxed condition for a conforming product is input, and therefore a defective pin is expected to exist in this search range.

Firstly, in step S7 of FIG. 7, the non-relaxed condition determined in step S6 is input for the search range one half as large as the search range of step 6, while the relaxed condition is input for the remaining half search range (other than the search range of pins Nos. 1 to 3 and pins Nos. 9 to N) to measure the LSI device. Secondly, the pins for which the non-relaxed condition is to be input are replaced with the pins for which the relaxed condition is to be input, so that the condition reverse to the first case is input to measure the LSI device. After that, the pins Nos. 1 to 3 are searched one by one to specify a defective pin.

On the other hand, other relaxed conditions for a conforming product are found for the search range of pins Nos. 9 to N to track down a defective pin. In other words, even in the case in which there exist a multiplicity of defective pins due to which the measurement fails, the defective pins can be detected recursively.

Figure 8:
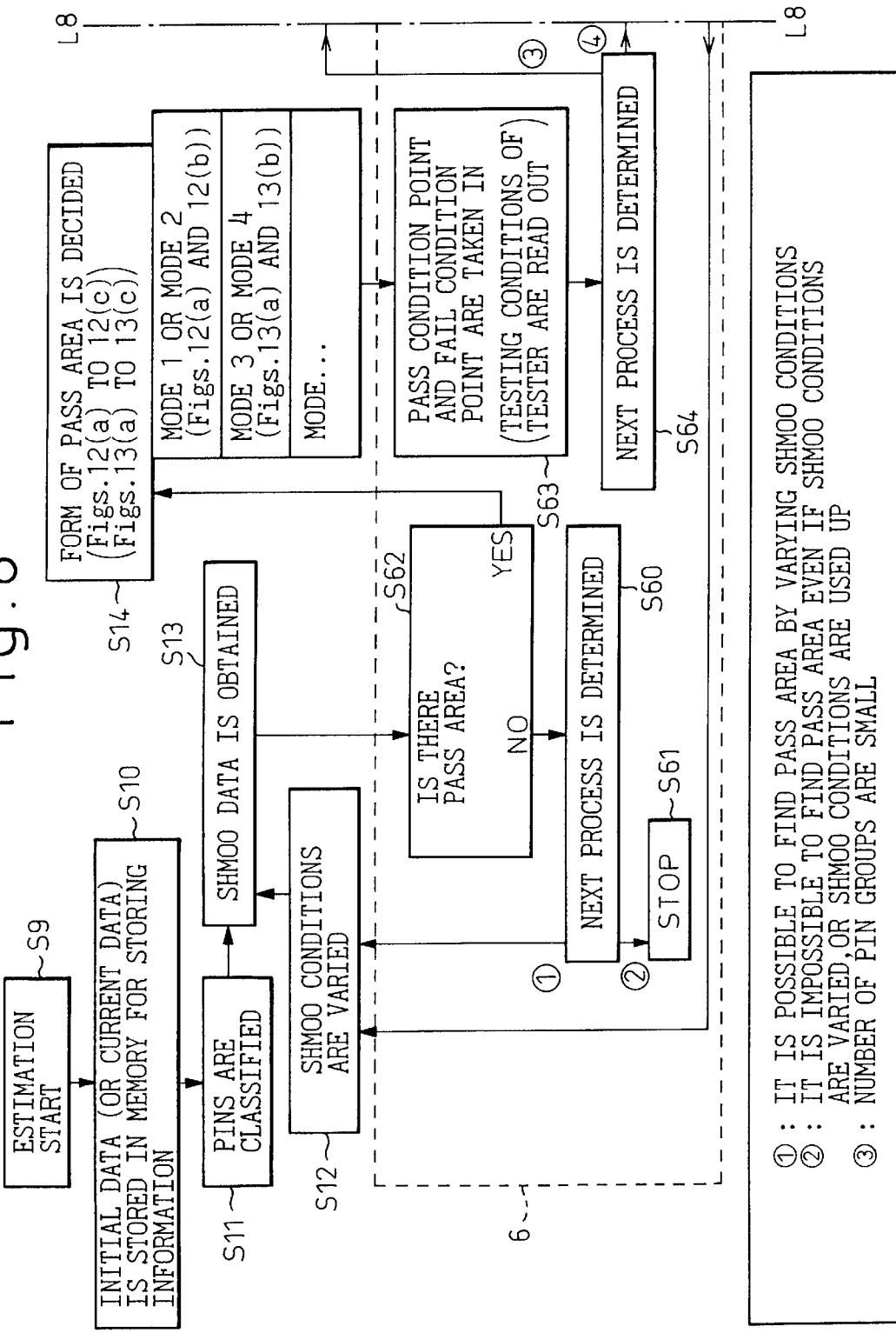
FIG. 8 is a first flowchart for explaining the overall operation of a system controller shown in FIG. 2.
Figure 9:
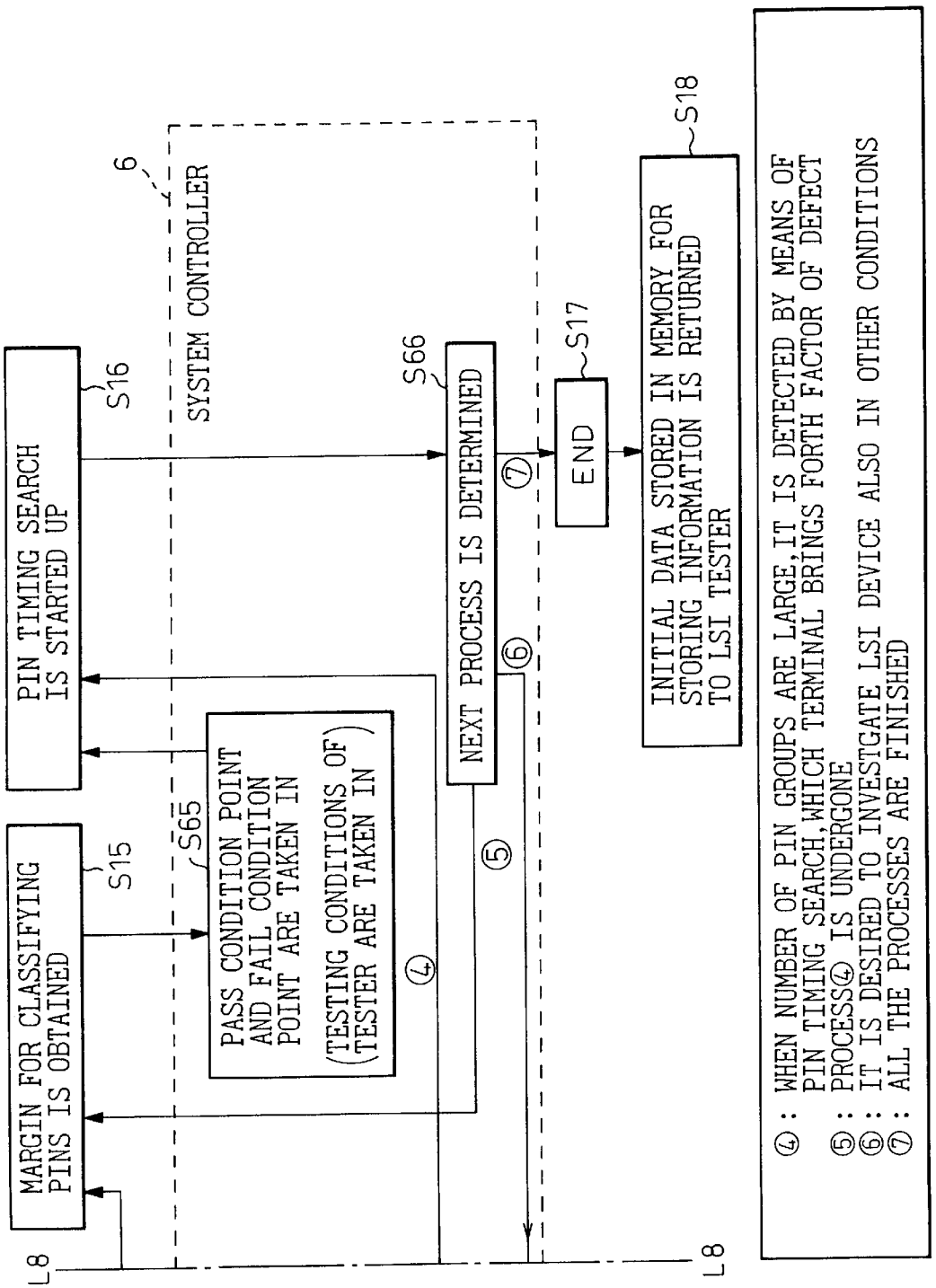
FIG. 9 is a second flowchart for explaining the overall operation of a system controller shown in FIG. 2.

FIGS. 8 and 9 are first and second flowcharts, respectively, for explaining the overall operation of the system controller shown in FIG. 2. An explanation will be given here of the manner in which the steps for specifying a factor of defect of the LSI device are controlled based on the results of the test and estimation of the LSI device conducted by operating the system controller 6 (FIG. 2) in the main steps ① to ⑦ in that order and thus altering the input conditions of the LSI device.

As shown in step 9 of FIG. 8, assume that the test and evaluation are conducted on a device to be measured such as the LSI device by operating the system controller 6. First, the initial setting (or the current setting) is written and stored in the memory for storing information for setting conditions (step S10). Then, the data related to the information for setting the LSI testing conditions for all the pins of the LSI device are collected, and the pins are classified into a plurality of groups each having the same data of testing conditions (step S11).

Further, based on the SHMOO conditions selected by the switching operation of the system controller 6 (step S12), the data on the testing conditions related to the timing set, the waveform format, timing and input level are altered two-dimensionally to obtain the SHMOO data (step S13). The system controller 6 permits the test and evaluation of the LSI device to be conducted based on the SHMOO data obtained in step S13 and determines whether or not the pass area exists for the results of the test and evaluation (step S62). In the case in which it is determined that there is no pass area for the results of the test and evaluation, the following process (① or ②) for conducting the test and evaluation of the LSI is determined based on the SHMOO conditions after change (step S60).

As shown in process ①, as far as the possibility exists to find a pass area for a conforming device by switching the SHMOO condition, the SHMOO condition can switched any number of times. In the case in which there is no possibility of finding a pass area by switching the SHMOO condition as shown in process ② or the SHMOO condition is depleted, on the other hand, the test and evaluation of the LSI device based on the SHMOO data is terminated (step S61).

In the case in which it is determined that there is a pass area for the results of the test and evaluation of the LSI device, the unit 30 (FIG. 4) for obtaining and storing the SHMOO data determines the form of the pass area described later with reference to FIGS. 12(a), 12(b), 12(c), 13(a), 13(b) and 13(c) (step S14). The form of this pass area is classified into a plurality of modes (modes 1 to 4, for example) depending on which portion of the two-dimensional graph the pass area is located at. Further, the system controller 6 reads a pass condition point indicating the condition for passing and a fail condition point indicating the condition for failing on the two-dimensional graph as testing conditions of the LSI tester (step S63). Then, the next process (③ or ④) is determined for obtaining the data concerning the margin of the testing conditions of the LSI tester read in this way (step S64).

In the case in which the pin groups are few in number, as shown in process ③ in FIG. 8, the data concerning the margin of classifying pins is obtained without specifying the pin group constituting a factor of defect from the pin timing search (step S15 in FIG. 9). In the case in which there are many pin groups, on the other hand, the pin timing search is initiated as shown in process ④ of FIG. 9, in order to shorten the time required for test and evaluation thereby to find out a particular pin group constituting a factor of defect (step S16 of FIG. 9).

Further, the system controller 6 reads a pass condition point and a fail condition point as a testing condition of the LSI tester from the data concerning the margin of classifying the pins obtained by step S15 through process ③ (step S65).

On the other hand, after the pin timing search is conducted in step S16 through process ④, the data concerning the margin of classifying the pins is obtained in step S15 through process ⑤. Further, in the case in which the investigation of the LSI device is desired by altering the other testing conditions, the SHMOO condition is switched in step S12 of FIG. 19 through process ⑥ thereby to conduct the test and evaluation of the LSI device in a similar manner to that described above.

In the case in which the test and evaluation has been conduced on the LSI device by altering all the testing conditions, all the processes are completed as shown in process ⑦ (step S17 in FIG. 9). At this time, the initial setting stored in the memory for storing information for setting the testing conditions is returned to the body of the LSI tester (step S18 in FIG. 9).

Figure 10:
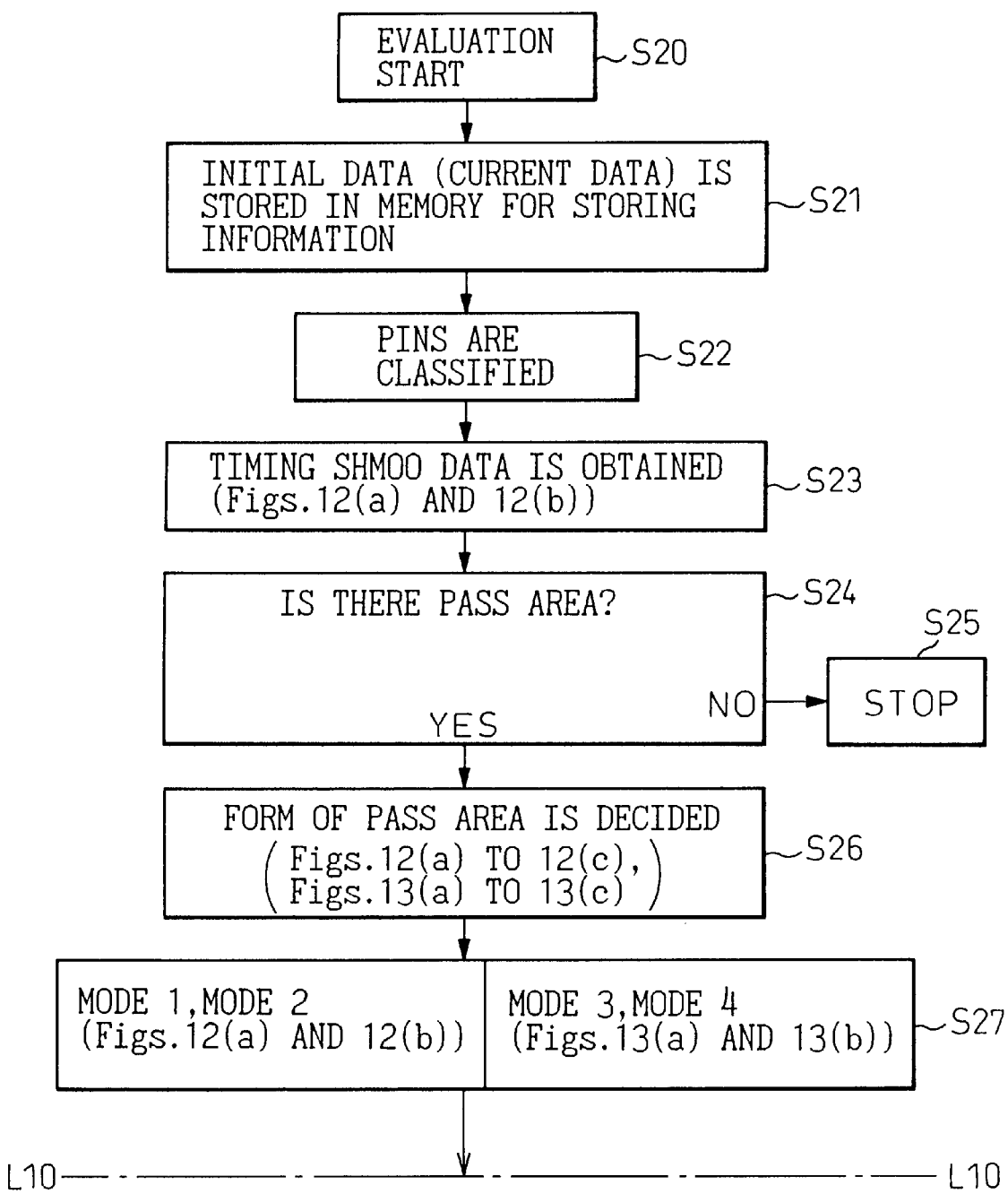
FIG. 10 is a first flowchart for explaining the steps for detecting a defective pin by a device test and evaluation method according to a preferred embodiment.
Figure 11:
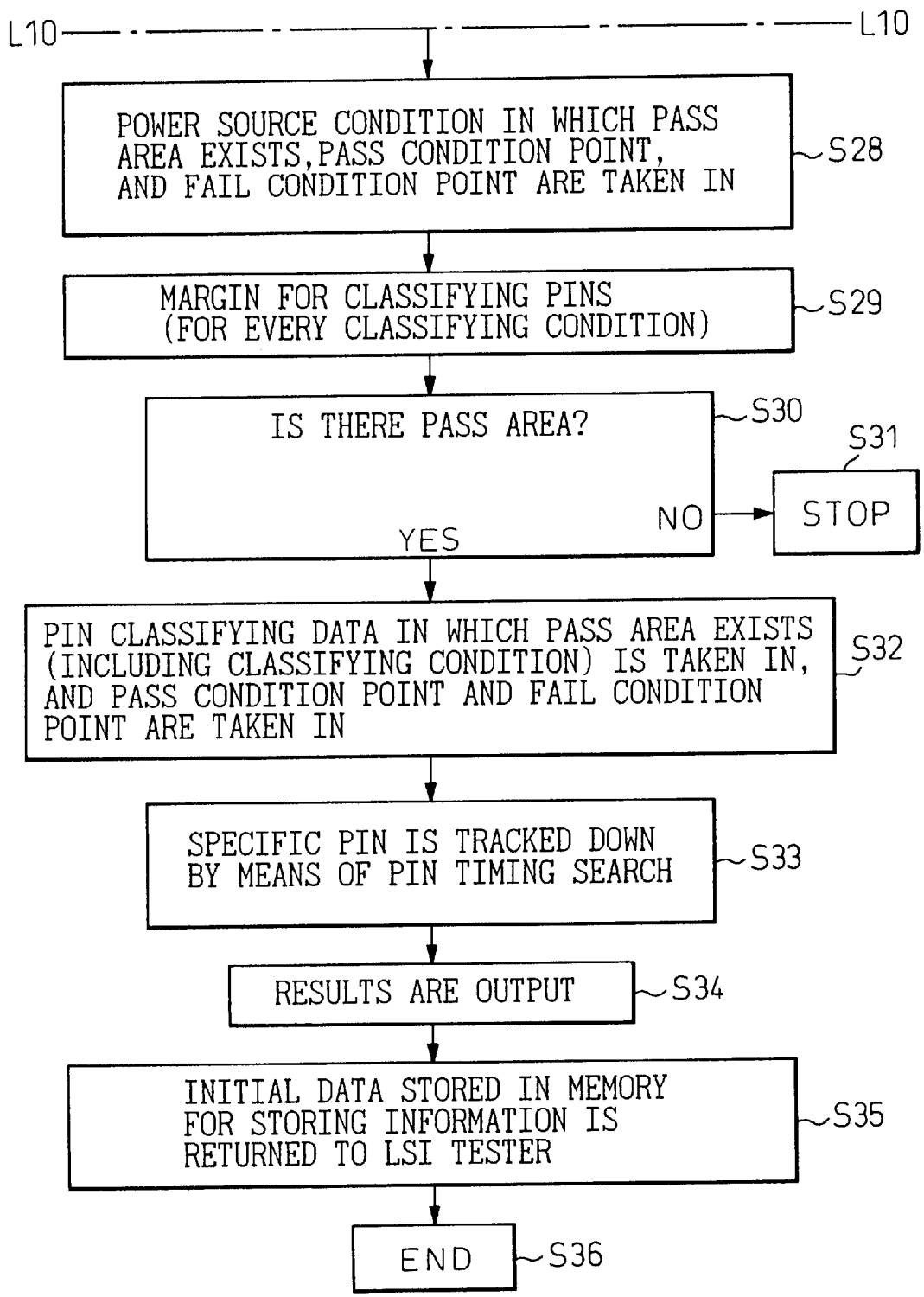
FIG. 11 is a second flowchart for explaining the steps for detecting a defective pin by a device test and evaluation method according to a preferred embodiment.

FIGS. 10 and 11 are first and second flowcharts, respectively, for explaining the steps of detecting a defective pin by a device test and evaluation method according to a preferred embodiment; FIGS. 12(a), 12(b) and 12(c) are diagrams showing an example of the form of the pass area and the margin of classifying the pins in modes 1 and 2; and FIGS. 13(a), 13(b) and 13(c) are diagrams showing an example of the form of the pass area and the margin of classifying the pins in modes 3 and 4.

In FIG. 10, assume that the device test and evaluation method according to this embodiment is executed. The test and evaluation of the LSI device is started (step S20), and the initial setting (or the present setting) is written and stored in a memory for storing information for setting the testing conditions (step S21). Then, the data are collected on the data concerning the information for setting the LSI testing conditions for all the pins of the LSI device, and the pins are classified into a plurality of groups each having the pins of the same data for the testing conditions (step S22).

In step S23, based on the SHMOO conditions selected in advance, the data of the testing conditions related to the timing set, the waveform format, the timing and the input level are two-dimensionally altered to obtain the timing SHMOO data.

An example of this timing SHMOO data is shown in FIGS. 12(a), 12(b) or 13(a), 13(b). In FIGS. 12(a), 12(b) or 13(a), 13(b), the testing conditions including the source voltage are changed from a typical value to conditions +1, +2 or conditions −1, −2 along the, ordinate, while all the signal timing are changed up to K times as large a typical value (K: real number, typically 0.5 to 1.5) along the abscissa, and a point P corresponding to the condition for a conforming LSI device (i.e. the pass condition point) is plotted. The area on the two-dimensional graph in which the pass condition point P is formed is defined as a pass area.

Further, in step S24, the LSI device is tested and evaluated based on the timing SHMOO data obtained in step S23 described above and it is determined whether or not a pass area exists for the results of test and evaluation. In the case in which it is determined that there is no pass area for the results of test and evaluation and there is no possibility of finding a pass area, the test and evaluation of the LSI device based on the timing SHMOO data is terminated (step S25).

In the case in which it is determined that there is a pass area for the results of test and evaluation of the LSI device, on the other hand, the form of the pass area is determined in step S26 as shown in FIGS. 12(a) to 12(c) and 13(a) to 13(c). An example of the form of the pass area is shown in FIGS. 12(a), 12(b) and 13(a), 13(b). FIG. 12(a) shows a pass area of mode 1 indicating a pass area existing on the right side of the graph, and FIG. 12(b) a pass area of mode 2 indicating a pass area existing on the left side of the graph. Further, FIG. 13(a) shows a pass area of mode 3 indicating a pass area on the lower side of the graph, and FIG. 13(b) shows a pass area of mode 4 indicating a pass area on the upper side of the graph (step S27).

Further, in step 28 of FIG. 11, the power condition and the pass condition point existing in the pass area of modes 1 to 4 in FIGS. 12(a) to 12(c) and 13(a) to 13(c) and the fail condition point outside the pass area are taken in. Furthermore, in step S29 of FIG. 11, the data concerning the margin of classifying the pins for each classification condition is obtained.

An example of the data concerning the margin of classifying pins is shown in FIGS. 12(c) and 13(c). FIG. 12(c) shows the data concerning the margin of the timing (T1, T2, and T3) changed for each of a plurality of pin groups (#1 and #2) in the pass area of mode 1, FIG. 12(c) the data concerning the margin of classifying the pins with the timing (T1, T2, and T3) changed for each of a plurality of pin groups (#1 and #2) in the pass area of mode 3, and FIG. 13(c) the data concerning the margin of classifying the pins with the input level (Vt), the output level (Out) and the current (IL) changed for each of a plurality of pin groups (#1 and #2) in the pass area of mode 3.

Further, in step S30 of FIG. 11, the LSI device is tested and evaluated based on the data concerning the margin of classifying the pins obtained in step S29 described above, and it is determined whether there is a pass area or not for the results of the test and estimation. In the case in which it is determined that there is no pass area for the results of the test and evaluation, it is considered that there is no margin classifying the pins, and the test and evaluation of the LSI device is terminated (step S31).

Assume that it is determined that there is a pass area for the results of the test and estimation of the LSI device. In step S32 of FIG. 11, the data concerning the pin classification (including the classification condition) existing in the pass area are taken in, as well as the pass condition point in the pass area and the fail condition point outside the pass area. Further, in step S33 of FIG. 11, the pin timing is searched for and a specified pin in the pin group which makes up a factor of defect is tracked down. Furthermore, the results of tracking down such a defective pin are output (step S34).

After testing and evaluating the LSI device by changing the various testing conditions including the power source condition, the input level, the output level, the signal timing and the current, the initial setting stored in the memory for storing the information for setting the testing conditions is returned to the body of the LSI tester, thus completing the process for detecting a defective pin (FIGS. 35 and 36 in FIG. 11).

Figure 15:
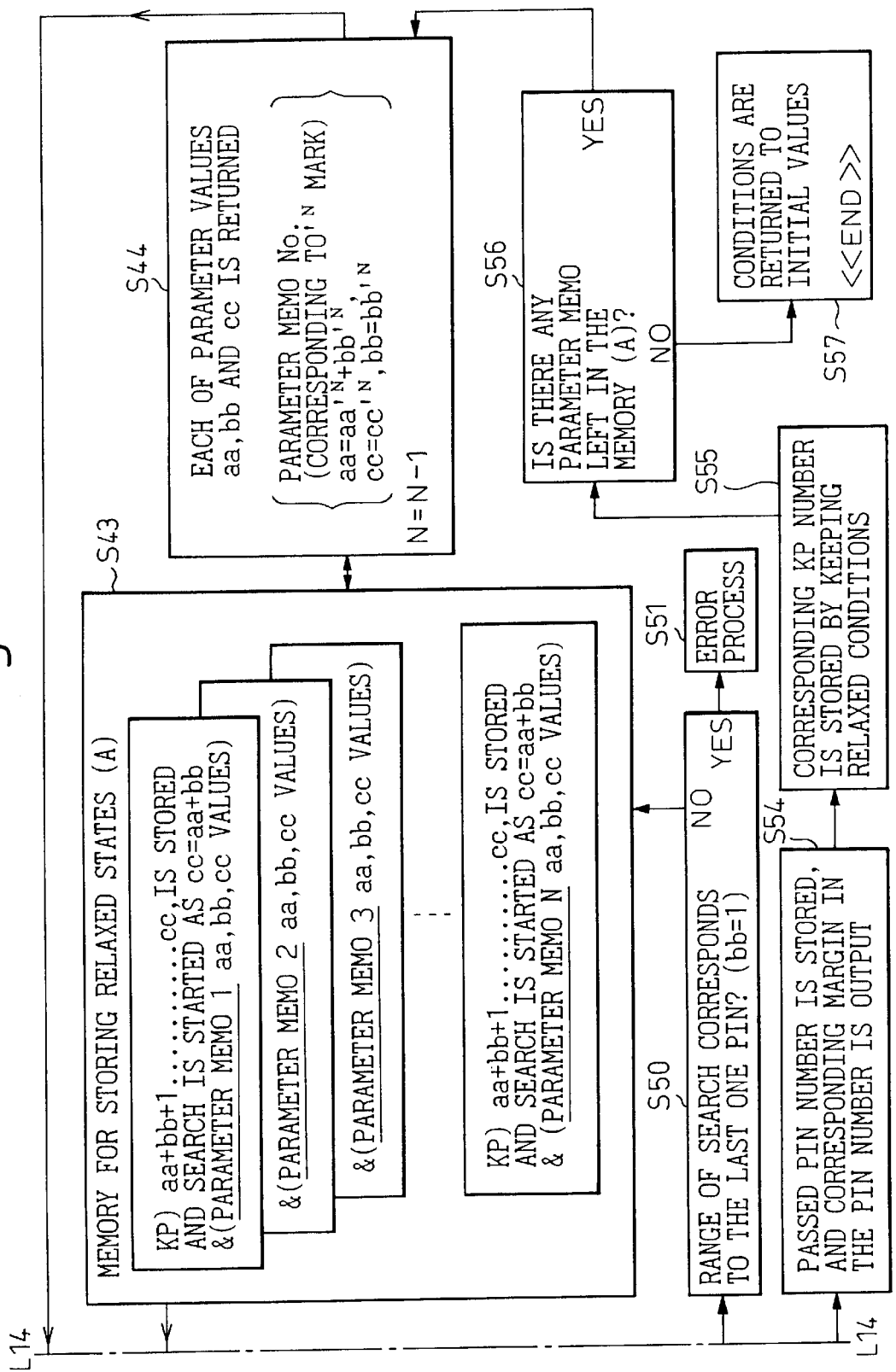
FIG. 15 is a second flowchart for explaining the steps for specifying a factor of defect by operating a program in a device test and evaluation system according to the present invention.

FIGS. 14 and 15 are first and second flowcharts, respectively, for explaining the steps for specifying a factor of defect by operating the program in the system for testing and evaluating the device according to the present invention. In this case, an explanation will be given of the flow of a program for quickly finding which portion of a search range includes a defective pin having a factor of defect based on the results (pass or fail) of the simulation obtained by altering the input conditions of the LSI device.

In FIG. 14, the number 51 of searches of the input conditions of the LSI device is defined as a variable KP. An example of the number of searches KP is the number of pins of the LSI device, the number of tester units, the number of timing sets or the number of vector steps.

The program for test and evaluation of the LSI device is activated to start the test and evaluation of the LSI device (step S40). Further, in step S41, the pin No. N of a specific pin group of the LSI device is set to the initial value 0 (N=0). On the other hand, the variable aa is set to the initial value 0, and the variables bb, cc to the maximum value (Max#), respectively.

Further, the relaxed condition (pass condition) is input which makes a conforming product in the search range (variable bb=bb/2) one half as large as the present search range of the LSI device (step S42). Specifically, by dividing the search range into halves each time, a defective pin having a factor of defect is found at high speed. More specifically, as shown in step S45, the relaxed condition is input in the search range with the number of searches KP=aa+1, . . . , aa+bb, and the LSI device is measured (first item). After completing this measurement, the variables aa, bb are returned to the initial setting.

Further, the relaxed condition is input for the search range other than that of step S45. More specifically, as shown in step S46, the relaxed condition is input in the search range with the number of searches KP=aa+bb+1, . . . , cc, and the LSI device is measured (second item). After completing this measurement, the variables aa, bb and cc are returned to the initial setting.

Furthermore, in the case in which the results of measurement of the first and second items above are both passed (step S47), the factor of defect cannot be specified, and therefore the measurement of the LSI device is terminated by the error process (step S48). In the case in which one of the results of measurement of the first and second items fails (step S49), the relaxed condition for the next search range (cc=aa+bb for pass in the first item, and aa=aa+bb for pass in the second item) is determined (step S53) based on the results of measurement in the first and second items, as long as the present search range contains only the last pin (bb=1) and the further division is impossible (step S52). After that, the process returns to step S42, and the relaxed condition is input for the search range (variable bb=bb/2) one half as large as the present search range thereby to conduct the measurement of the LSI device.

The various relaxed conditions input for the various search ranges, as shown in step S43 of FIG. 15, are held in the relaxed state storage means (A) as the parameter memo 1, the parameter memo 2, the parameter memo 3, . . . , the parameter memo N with the values of the variables KP, aa, bb and cc stored for each pin. In the test and estimation of each pin of the LSI device, as shown in step S44 of FIG. 15, the corresponding parameter memos are sequentially taken out (parameter memos Nos. aa=aa'$_N$+bb'$_N$, cc=cc'$_N$, bb=bb'$_N$, N=N−1).

In step S49 of FIG. 14, assume that the measurement results of the first and second items both fail. In the case in which the present search range has only the last pin (bb=1) and the further division is impossible (step S50 in FIG. 15), the error process is conducted and the measurement of the LSI device is terminated (step S51 of FIG. 15).

In step S52 of FIG. 14, assume that the measurement results of the first and second items both fail. In the case in which the present search range has only the last pin (bb=1) and the further division is impossible, the pin number passed as the results of measurement is stored, and the data concerning the margin of the relaxed condition for this pin number is output (step S54 of FIG. 15). Further, the number of KP is held while the present relaxed condition remains set (step S55 of FIG. 15).

In the case in which the parameter memo set in the relaxed state storage means (A) remains (step S56 in FIG. 15), the process proceeds to step S44 to take out the particular parameter memo. In the case in which the parameter memo set in the relaxed condition state means (A) is not left, on the other hand, the setting of the relaxed condition is returned to the original setting thereby to complete the test and evaluation of the LSI device (step S57 in FIG. 15).

Figure 16:
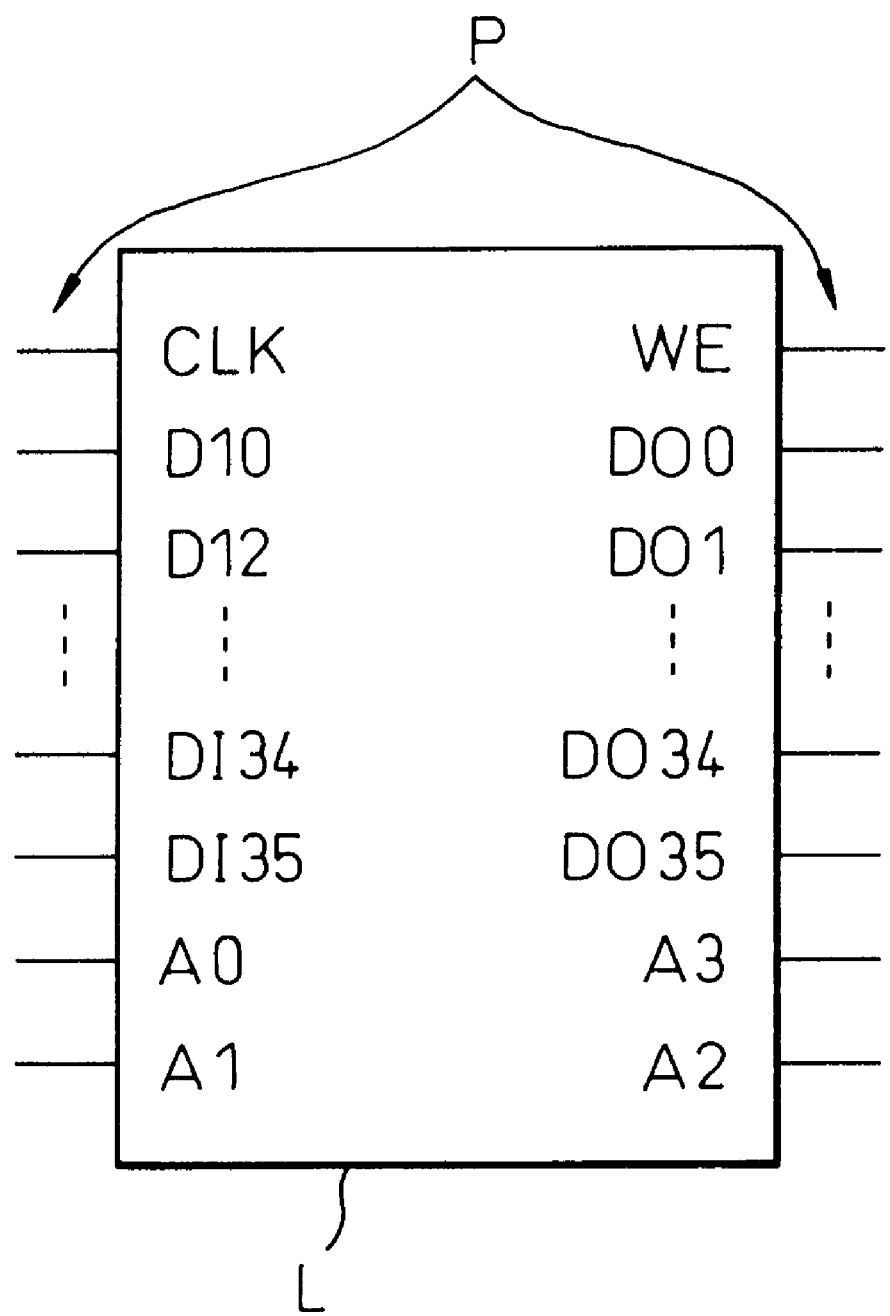
FIG. 16 is a plan view schematically showing an example of an LSI device to be tested and evaluated according to a preferred embodiment.
Figure 17:
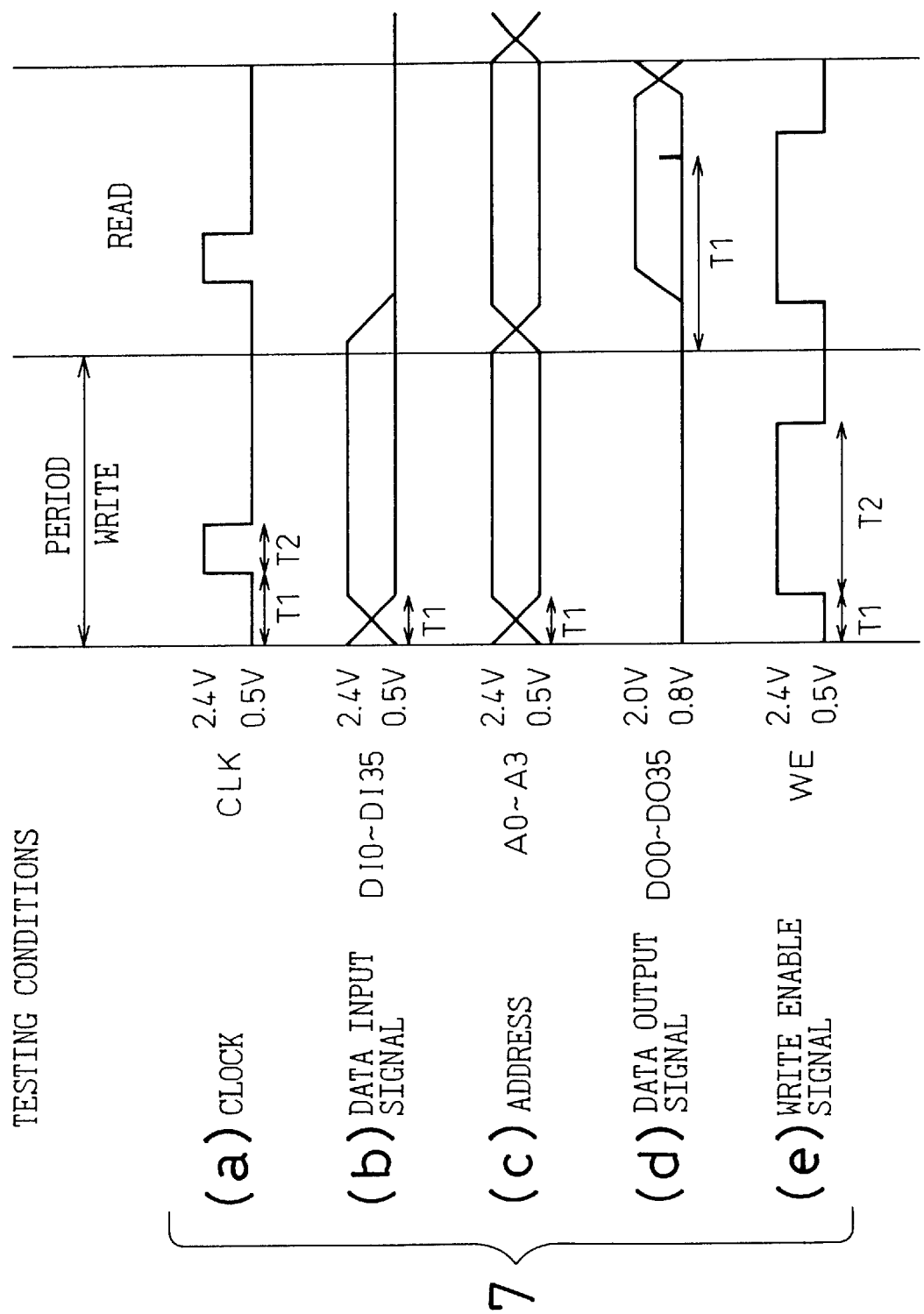
FIG. 17 is a timing chart showing an example of the testing conditions for a LSI device shown in FIG. 16.
Figure 18:
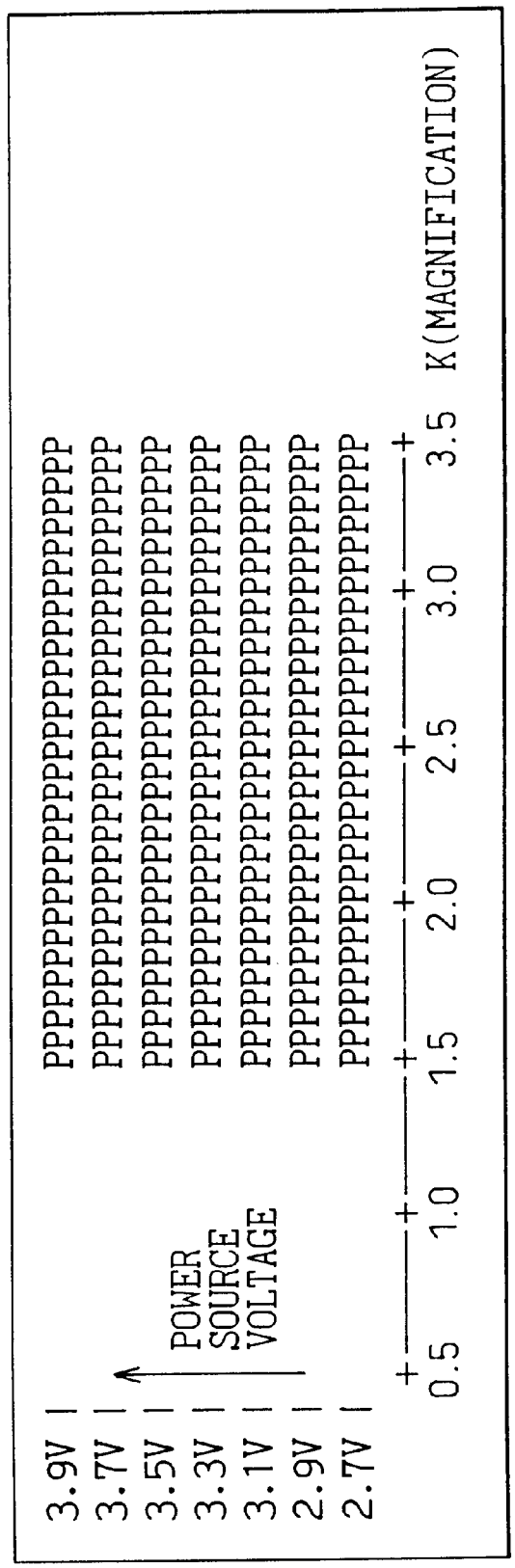
FIG. 18 is a graph for determining whether an LSI device conforms or is defective while altering the values obtained by magnifying the scale of all the timing by a real number and the source voltage.

FIG. 16 is a plan view schematically showing an example of the LSI device to be tested and evaluated according to a preferred embodiment; FIG. 17 is a timing chart showing an example of the testing conditions for the LSI device of FIG. 16; FIG. 18 is a graph plotting the determination of conforming and defective products with a real-number multiple of each timing and the source voltage changed; and FIG. 19 is a diagram showing the margin of classifying the pins obtained for each pin group. In this case, a specific operation of the system for testing and evaluating the device according to this embodiment will be explained taking the test and evaluation of the LSI device L shown in FIG. 16 as an actual example.

As shown in FIG. 16, a plurality of pins P of the LSI device include a clock input pin (CLK), data input pins (DI0 to DI35), address input pins (A0 to A3), data output pins (DO0 to DO35) and a write enable input pin (WE: control signal input pin). The types of these pins, however, cannot be identified in the stages before test and evaluation.

The testing conditions including the source voltage supplied to the LSI device, the input level (VIH, VIL) for applying an input, an output level (VOH, VOL) for determining an output, the write and read timing of the signal (T1, T2 and T3) and the period (T=100 ns) are set as shown in FIG. 17 for (a) the clock CLK, (b) the data input signals DI0 to DI35, (c) the addresses A0 to A3, (d) the data output signals DO0 to DO35 and (e) the write enable signal WE.

The various testing conditions making up the basis of pin classification are summarized in Table 1 below.

TABLE 1

Testing conditions constituting basis of pin classification

| Pin No. | Pin name | Timing set | Wave-form format | Level for applying input | | Level for determining output | | | |
|---|---|---|---|---|---|---|---|---|---|
| | | | | VIH | VIL | VOH | VOL | T1 | T2 |
| 1 | CLK | 1 | PULSE | 2.4 | 0.5 | | | 40 | 20 |
| 2 | DI0 | 1 | DATA | 2.4 | 0.5 | | | 20 | |
| 3 | DI1 | 1 | DATA | 2.4 | 0.5 | | | 20 | |
| : | : | 1 | DATA | 2.4 | 0.5 | | | 20 | |
| 36 | DI34 | 1 | DATA | 2.4 | 0.5 | | | 20 | |
| 37 | DI35 | 1 | DATA | 2.4 | 0.5 | | | 20 | |
| 38 | A0 | 1 | DATA | 2.4 | 0.5 | | | 20 | |
| 39 | A1 | 1 | DATA | 2.4 | 0.5 | | | 20 | |

TABLE 1-continued

Testing conditions constituting basis of pin classification

| Pin No. | Pin name | Timing set | Wave-form format | Level for applying input VIH | Level for applying input VIL | Level for determining output VOH | Level for determining output VOL | T1 | T2 |
|---|---|---|---|---|---|---|---|---|---|
| 40 | A2 | 1 | DATA | 2.4 | 0.5 | | | 20 | |
| 41 | A3 | 1 | DATA | 2.4 | 0.5 | | | 20 | |
| 42 | DO35 | 1 | STRB | | | 2.0 | 0.8 | 80 | |
| 43 | DO34 | 1 | STRB | | | 2.0 | 0.8 | 80 | |
| : | : | 1 | STRB | | | 2.0 | 0.8 | 80 | |
| 76 | DO1 | 1 | STRB | | | 2.0 | 0.8 | 80 | |
| 77 | DO0 | 1 | STRB | | | 2.0 | 0.8 | 80 | |
| 78 | WE | 1 | PULSE | 2.4 | 0.5 | | | 10 | 90 |

Period T = 100 ns

The testing conditions shown in Table 1 are digitized for each pin number (Nos. 1 to 7) when reading out the information for setting the testing conditions from the LSI tester proper. In this case, numeral 0 is substituted into the vacant (NULL) columns.

More specifically, as for the waveform format of Table 1, the pulse (PULSE) is set to 1, the data (DATA) is set to 2 and the strobe (STRB) is set to 3. As for the input level (VIH, VIL) and the output level (VOH, VOL), on the other hand, 2.4 V is set to 1, 0.5 V to 2, 2.0 V to 3, and 0.8 V to 4. As for the signal timing (T, T2), 40 ns is set to 1, 20 ns to 2, 80 ns to 3, 10 ns to 4 and 90 ns to 5.

Further, the aforementioned digitized values are classified and the pins having the same value are grouped as a pin group of the same type. As a result, the pins can be classified into the following four groups.

Pin group #1=pin No. 1, pin name CLK
Pin group #2=pin No. 78, pin name WE
Pin group #3=pins Nos. 2, 3, 4, . . . , 36, 37, 38, 39, 40, 41, pin names DIO to DI35, A0 to A3
Pin group #4=pins Nos. 42, 43, . . . ,76, 77, pin names DO0 to DO35

In the case in which the pin type is known in advance, the pin group #3 can be separated into the data input pins (DIO to DI35) and the address input pins (A0 to A3) by inputting information from outside. The aforementioned classification applies, however in the total absence of pin information.

The flow for searching for a defective pin will be explained with reference to the case in which the margin of timing T1 is lacking (T1 timing marginless) for pin No. 3 (3 pins) and pin No. 38 (38 pins).

First, as shown in FIG. 18, all the timings are changed up to a magnification K (K: real number of 0.5 to 3.5) of a reference value along the abscissa of the graph, while the point corresponding to the condition for a conforming product (i.e. pass condition point) P with the source voltage is changed is plotted along the ordinate. As a result, the timing SHMOO data for determining whether the LSI device is conforming or defective is obtained. The area formed by the pass condition point P on the two-dimensional graph indicating this SHMOO data is defined as a pass area.

The mode of the timing SHMOO data in FIG. 18 shows that a marginless timing is involved. In this case, it is seen that a conforming product can be obtained by setting the timing to 1.5 times or more as large.

Then, the timing is changed for each pin type (pin group) thereby to obtain the margin for classifying the pins. Taking into account that a conforming product is obtained at a timing not less than 1.5 times, the timing search width is optimized. As a result, the margin for classifying the pins for every pin type as shown in FIG. 19 is obtained. In FIG. 19, characters TYP, ST, SP and DL designate the reference value, the minimum value, the maximum value and the delay time, respectively. Further, F designates a point corresponding to the condition for a defective product (i.e. a fail condition point).

As shown in FIG. 19, it is seen that the pin group #3 passes when T1 (reference value TYP=20 ns) is set to 10 ns.

Then, a defective pin is specified by changing the input timing.

Pin group #3=Nos. 2, 3, 4, 5, . . . , 38, 39, 40, 41 (underlined numbers indicate defective pins)

Assuming that the pass condition for this LSI device is T1=5 ns, the condition is changed for each half of a plurality of pins constituting the elements of the pin group #3, and the pass/fail decision is made (normal condition is T1=20 ns).

| 20 pins 2,3,4,5, . . . ,18,19,20,21 | 20 pins 22,23,24,25, . . . ,38,39,40,41 | |
|---|---|---|
| T1 = 5 ns | T1 = 20 ns | fail |
| T1 = 20 ns | T1 = 5 ns | fail |

Both cases fail, and therefore a defective pin is seen to exist on both right and left sides.

Further, the right side is fixed to T1=20 ns, the fail condition is searched for on the left side.

| 10 pins 2,3,..,10,11 | 10 pins 12,13,..,20,21 | 20 pins 22,23,24,25,..,38,39,40,41 | |
|---|---|---|---|
| T1 = 5 ns | T1 = 20 ns | T1 = 5 ns | pass |
| T1 = 20 ns | T1 = 5 ns | T1 = 5 ns | fail |

A pass is obtained when the condition for a conforming product of pin Nos. 2 to 11 is set to the pass condition (T1=5 ns), and therefore it is seen that a defective pin exists in pins Nos. 2 to 11 and no defective pin exists in pins Nos. 12 to 21. Thus, a fail condition search is continued for pins Nos. 2 to 11.

| 5 pins 2,3,4,5,6 | 5 pins 7,8,9,10,11 | 10 pins 12, . . . ,21 | |
|---|---|---|---|
| T1 = 5 ns | T1 = 20 ns | T1 = 20 ns | pass |
| T1 = 20 ns | T1 = 5 ns | T1 = 20 ns | fail |
| 20 pins 22,23,...,38,39,40,41 | | | |
| T1 = 5 ns | | | pass |
| T1 = 5 ns | | | fail |

A pass is obtained when the condition for a conforming product of pin Nos. 2 to 6 is set to the pass condition (T1=5 ns), and therefore it is seen that a defective pin exists in pins Nos. 2 to 6 and no defective pin exists in pins Nos. 7 to 11.

At this time, the number of pins constituting the elements is not more than 8, and therefore the search is made by scanning the pins Nos. 2 to 6 one by one.

| 2 | 3 | 4 | 5 | 6 | |
|---|---|---|---|---|---|
| T1 = 20 ns | 5 ns | 5 ns | 5 ns | 5 ns | pass |
| T1 = 5 ns | 20 ns | 5 ns | 5 ns | 5 ns | fail |
| T1 = 5 ns | 5 ns | 20 ns | 5 ns | 5 ns | pass |
| T1 = 5 ns | 5 ns | 5 ns | 20 ns | 5 ns | pass |
| T1 = 5 ns | 5 ns | 5 ns | 5 ns | 20 ns | pass |
| 15 pins | | | 20 pins | | |
| 7,...,21 | | | 22,23,...,38,39,40,41 | | |
| T1 = 20 ns | | | T1 = 5 ns | | pass |
| T1 = 20 ns | | | T1 = 5 ns | | fail |
| T1 = 20 ns | | | T1 = 5 ns | | pass |
| T1 = 20 ns | | | T1 = 5 ns | | pass |
| T1 = 20 ns | | | T1 = 5 ns | | pass |

The foregoing results show that the pin No. 3 (3 pins) is defective.

The pass condition (T1=5 ns) is set so that these three pins are conforming, and the search for the fail condition is continued for pins Nos. 22 to 41.

| 2 | 3 | 18 pins 4,...,21 | |
|---|---|---|---|
| T1 = 20 ns | 5 ns | 20 ns | fail |
| T1 = 20 ns | 5 ns | 20 ns | pass |
| 10 pins 22,23,...,30,31 | | 10 pins 32,33,...,38,39,40,41 | |
| T1 = 5 ns | | T1 = 20 ns | fail |
| T1 = 20 ns | | T1 = 5 ns | pass |

A defective pin exists in pins Nos. 32 to 41, and no defective pin exists in pins Nos. 22 to 31. The search for the fail condition is further continued for pins Nos. 22 to 41.

| 2 | 3 | 28 pins 4,...,31 | |
|---|---|---|---|
| T1 = 20 ns | 5 ns | TL = 20 ns | fail |
| T1 = 20 ns | 5 ns | T1 = 20 ns | pass |
| 5 pins 32,33,34,35,36 | | 5 pins 37,38,39,40,41 | |
| T1 = 5 ns | | T1 = 20 ns | fail |
| T1 = 20 ns | | T1 = 5 ns | pass |

A defective pin exists in pins Nos. 37 to 41, and no defective pin exists in pins Nos. 32 to 36.

At this time, the number of pins constituting the elements is not more than 8, and therefore the search is made for pins Nos. 37 to 41 by scanning them one by one.

| 2 | 3 | 33 pins 4,...,36 | 37 | 38 | |
|---|---|---|---|---|---|
| T1 = 20 ns | 5 ns | T1 = 20 ns | 20 ns | 5 ns | pass |
| T1 = 20 ns | 5 ns | T1 = 20 ns | 5 ns | 20 ns | fail |
| T1 = 20 ns | 5 ns | T1 = 20 ns | 5 ns | 5 ns | pass |
| T1 = 20 ns | 5 ns | T1 = 20 ns | 5 ns | 5 ns | pass |
| T1 = 20 ns | 5 ns | T1 = 20 ns | 5 ns | 5 ns | pass |

| 39 | 40 | 41 | |
|---|---|---|---|
| 5 ns | 5 ns | 5 ns | pass |
| 5 ns | 5 ns | 5 ns | fail |
| 20 ns | 5 ns | 5 ns | pass |
| 5 ns | 20 ns | 5 ns | pass |
| 5 ns | 5 ns | 20 ns | pass |

The foregoing results show that pin No. 3 (3 pins) and pin No. 38 (38 pins) are defective. In this case, the test was conducted a total of 21 times. By using the method according to this embodiment, the number of times in which the test is conducted for determination is remarkably reduced, as compared with the test and evaluation method in which a plurality of pins of a LSI device are all tested sequentially.

Comparing the test and evaluation time for a LSI device of ball grid array type having a multiplicity of pins according to the conventional test and evaluation method with the test and evaluation method according to the present invention. As an example of a LSI device of ball grid array type, the test and evaluation is conducted on a LSI device having a total of 672 pins including 82 power pins, 84 GND pins and 506 signal pins. The various testing conditions constituting the basis of pin classification for this LSI device are summarized in Table 2 below.

TABLE 2

Testing conditions for LSI device of ball grid array type

| Pin No. | Timing set | Waveform format | VIH | VIL | VOH | VOL | T1 | T2 |
|---|---|---|---|---|---|---|---|---|
| 1 | 1 | PULSE | 2.4 | 0.5 | | | 40 | 20 |
| 2 | 1 | DATA | 2.4 | 0.5 | | | 20 | |
| 3 | 1 | DATA | 2.4 | 0.5 | | | 20 | |
| : | 1 | DATA | 2.4 | 0.5 | | | 20 | |
| 99 | 1 | DATA | 2.4 | 0.5 | | | 20 | |
| 100 | 1 | DATA | 2.4 | 0.5 | | | 20 | |
| 101 | 1 | DATA | 2.4 | 0.5 | | | 20 | |
| 102 | 1 | DATA | 2.4 | 0.5 | | | 20 | |
| : | 1 | DATA | 2.4 | 0.5 | | | 20 | |
| 199 | 1 | DATA | 2.4 | 0.5 | | | 20 | |
| 200 | 1 | STRB | | | 2.0 | 0.8 | 80 | |
| 201 | 1 | STRB | | | 2.0 | 0.8 | 80 | |
| : | 1 | STRB | | | 2.0 | 0.8 | 80 | |
| 299 | 1 | STRB | | | 2.0 | 0.8 | 80 | |
| 300 | 1 | STRB | | | 2.0 | 0.8 | 80 | |
| : | 1 | PULSE | 2.4 | 0.5 | | | 10 | 90 |

The testing conditions shown in Table 2 are substantially identical to those shown in Table 1 above except for the total number of pins, and therefore will not be explained in detail below.

In the case in which the LSI device is judged to be defective as a result of the function test thereof, the condition that the LSI device becomes conforming may be found by shifting by 5 ns the timing edges of each of two signal pins among a plurality of signal pins.

If it is assumed that the timing edges of two or more than three pins are required to be shifted, in the conventional test and estimation method, the pass condition cannot be searched for by the simple acquisition of a pin margin. Therefore, the timing SHMOO data is obtained first of all to search for the timing that constitutes a pass. In this case, 20 points is acquired in the direction of power supply, and, 400 points in the direction of timing. Assuming that the test and estimation time for one point is 100 ms, the measurement time is given as 400×100 ms×20=800 secs=13.3 minutes.

In acquiring the data of a pin margin in the case in which the pin data fails in the pass condition, 20 points of the pin margin data is acquired for each pin. If the testing time per point is about 100 ms, the measurement time is given as 506×100 ms×20=1012 secs=16.6 minutes Thus, the total is 29.9 minutes (1794 secs).

In the test and estimation method according to the invention, on the other hand, the pins can be classified into four groups according to the pin type from Table 2.

If it is assumed that the margin for classifying the pins has been obtained for the four types of pins on the same scale as the conventional test and evaluation method, the test and evaluation time is 4×100 ms×20=8 secs.

The search is conducted at a timing to make a pass from the margin for classifying the pins. Also, if it is assumed that the pins are classified into four groups of the same number of pins, and assumed that the search for a fail condition, is conducted at the rate of 126 pins for each group, the test and evaluation time per pin is given as $$\log_2(126\times2\times100 \text{ (ms)})=1.4 \text{ secs.}$$

For the assumed pass condition, the timing is required to be changed for two pins, which in turn requires two measurements for each testing and therefore the evaluation time thereof is given as $$\log_2(126\times2\times100 \text{ (ms)})=2.8 \text{ secs}$$

Thus the total of 10.8 secs is required.

Thus, from the viewpoint of the time required to test and evaluate a device, the test and evaluation method according to this invention is more effective than the conventional test and evaluation method, by one hundred times or more than one hundred times.

It will thus be understood from the foregoing description that according to the basic embodiment and preferred embodiments of the present invention, the information for setting the various conditions for testing a device, such as a LSI device, are read out, all the terminals are classified into a plurality of groups having different terminal types, and a defective terminal having a factor of defect is searched for by altering the testing conditions by using the SHMOO data or the like for the terminals types thus grouped. Thus, a factor of defect of the device to be measured can be assuredly found within a much shorter time than in the conventional test and evaluation method.

What is claimed is:

1. A system for testing and evaluating a device in which a test and an evaluation of said device are conducted by searching for a factor of defect of said device, comprising:

a unit classifying terminals of said device into a plurality of terminal types, based on information related to various testing conditions;

a unit obtaining data concerning a margin of said testing conditions by altering said testing conditions for every terminal type; and a unit searching for a factor of defect of a specific terminal type in accordance with the data concerning the margin of said testing conditions and detecting a defective terminal from said specific terminal type.

2. A system for testing and evaluating a device according to claim 1, wherein said plurality of terminal types include a group of clock input terminals, a group of data input terminals and address input terminals, a group of data output terminals and a group of control signal input terminals.

3. A system for testing and evaluating apparatus according to claim 1, wherein said testing conditions comprise a source voltage, an input level, an output level and a signal timing of said device.

4. A system for testing and evaluating a device according to claim 2, wherein said data concerning/the margin of said testing conditions are obtained by altering a source voltage, an input level and an output level of each of said terminal types, and shifting edges of said signal timing.

5. A method for testing and evaluating a device in which a test and an evaluation of a device are conducted by searching for a factor of defect of said device, comprising the steps of:

classifying terminals of said device into a plurality of terminal types, based on information related to various testing conditions;

obtaining data concerning a margin of said testing conditions by altering said testing conditions for every terminal type; and searching for a factor of defect of a specific terminal type in accordance with the data concerning the margin of said testing conditions, and detecting a defective terminal from said specific terminal type.

6. A system for testing and evaluating a device in which a test and an evaluation of said device are conducted by searching for a factor of defect of said device, comprising:

means for classifying the terminals of said device into a plurality of terminal types, based on information related to various testing conditions;

means for obtaining data concerning a margin of said testing conditions by altering said testing conditions for every terminal type; and means for searching for a factor of defect of a specific terminal type in accordance with the data concerning the margin of said testing conditions and detecting a defective terminal from said specific terminal type.

* * * * *